(12) United States Patent
More et al.

(10) Patent No.: US 12,243,919 B2
(45) Date of Patent: *Mar. 4, 2025

(54) METHOD AND STRUCTURE FOR METAL GATE BOUNDARY ISOLATION

(71) Applicant: Taiwan Semiconductor Manufacturing Company, Ltd., Hsin-Chu (TW)

(72) Inventors: Shahaji B. More, Hsinchu (TW); Chandrashekhar Prakash Savant, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/319,999

(22) Filed: May 18, 2023

(65) Prior Publication Data
US 2023/0299153 A1 Sep. 21, 2023

Related U.S. Application Data

(63) Continuation of application No. 17/233,355, filed on Apr. 16, 2021, now Pat. No. 11,658,216.
(Continued)

(51) Int. Cl.
*H01L 29/40* (2006.01)
*H01L 21/28* (2006.01)
(Continued)

(52) U.S. Cl.
CPC ...... *H01L 29/401* (2013.01); *H01L 21/28061* (2013.01); *H01L 21/28079* (2013.01);
(Continued)

(58) Field of Classification Search
CPC ......... H01L 21/28061; H01L 21/28079; H01L 21/823842; H01L 29/401; H01L 27/0924
See application file for complete search history.

(56) References Cited

U.S. PATENT DOCUMENTS

| 8,669,615 B1 | 3/2014 | Chang et al. |
| 8,772,109 B2 | 7/2014 | Colinge |

(Continued)

FOREIGN PATENT DOCUMENTS

| CN | 107492499 A | 12/2017 |
| CN | 107958872 A | 4/2018 |

(Continued)

*Primary Examiner* — Christine A Enad
(74) *Attorney, Agent, or Firm* — HAYNES AND BOONE, LLP

(57) ABSTRACT

A semiconductor structure includes a first transistor adjacent a second transistor. The first transistor includes a first gate metal layer over a gate dielectric layer, and the second transistor includes a second gate metal layer over the gate dielectric layer. The first and the second gate metal layers include different materials. The semiconductor structure further includes a first barrier disposed horizontally between the first gate metal layer and the second gate metal layer. One of the first and the second gate metal layers includes aluminum, and the first barrier has low permeability for aluminum. A bottom surface of the first gate metal layer is directly on a top surface of the first barrier.

20 Claims, 22 Drawing Sheets

Related U.S. Application Data

(60) Provisional application No. 63/137,569, filed on Jan. 14, 2021.

(51) Int. Cl.
  *H01L 21/8238* (2006.01)
  *H01L 27/092* (2006.01)
  *H01L 29/49* (2006.01)

(52) U.S. Cl.
  CPC .. *H01L 21/823842* (2013.01); *H01L 27/0924* (2013.01); *H01L 29/495* (2013.01); *H01L 29/4966* (2013.01)

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,860,148 B2 | 10/2014 | Hu et al. |
| 8,962,400 B2 | 2/2015 | Tsai et al. |
| 9,093,514 B2 | 7/2015 | Tsai et al. |
| 9,105,490 B2 | 8/2015 | Wang et al. |
| 9,236,267 B2 | 1/2016 | De et al. |
| 9,236,300 B2 | 1/2016 | Liaw |
| 9,245,805 B2 | 1/2016 | Yeh et al. |
| 9,431,496 B2 | 8/2016 | Kang |
| 9,520,482 B1 | 12/2016 | Chang et al. |
| 9,576,814 B2 | 2/2017 | Wu et al. |
| 10,326,005 B2 | 6/2019 | Chang et al. |
| 10,707,303 B2 | 7/2020 | Wang et al. |
| 10,804,163 B2 | 10/2020 | Lee et al. |
| 11,152,475 B2 | 10/2021 | Huang et al. |
| 11,222,892 B2 | 1/2022 | Su et al. |
| 11,233,005 B1 | 1/2022 | Chen et al. |
| 11,355,601 B2 | 6/2022 | Chiang et al. |
| 11,387,346 B2 | 7/2022 | Huang et al. |
| 11,443,987 B2 | 9/2022 | Chen et al. |
| 11,527,622 B2 | 12/2022 | Tung et al. |
| 11,594,614 B2 | 2/2023 | Yu et al. |
| 11,600,533 B2 | 3/2023 | Hsu et al. |
| 2014/0151763 A1 | 6/2014 | Hung et al. |
| 2016/0351563 A1 | 12/2016 | Chen et al. |
| 2018/0108745 A1* | 4/2018 | Li .................... H01L 21/28026 |
| 2020/0035674 A1 | 1/2020 | Lu et al. |
| 2021/0082918 A1* | 3/2021 | Cheng ............. H01L 21/823828 |
| 2021/0366783 A1 | 11/2021 | Chu et al. |
| 2021/0407862 A1 | 12/2021 | More et al. |

FOREIGN PATENT DOCUMENTS

| | | |
|---|---|---|
| TW | 201742123 A | 12/2017 |
| TW | 201911468 A | 3/2019 |
| TW | 202034378 A | 9/2020 |

* cited by examiner

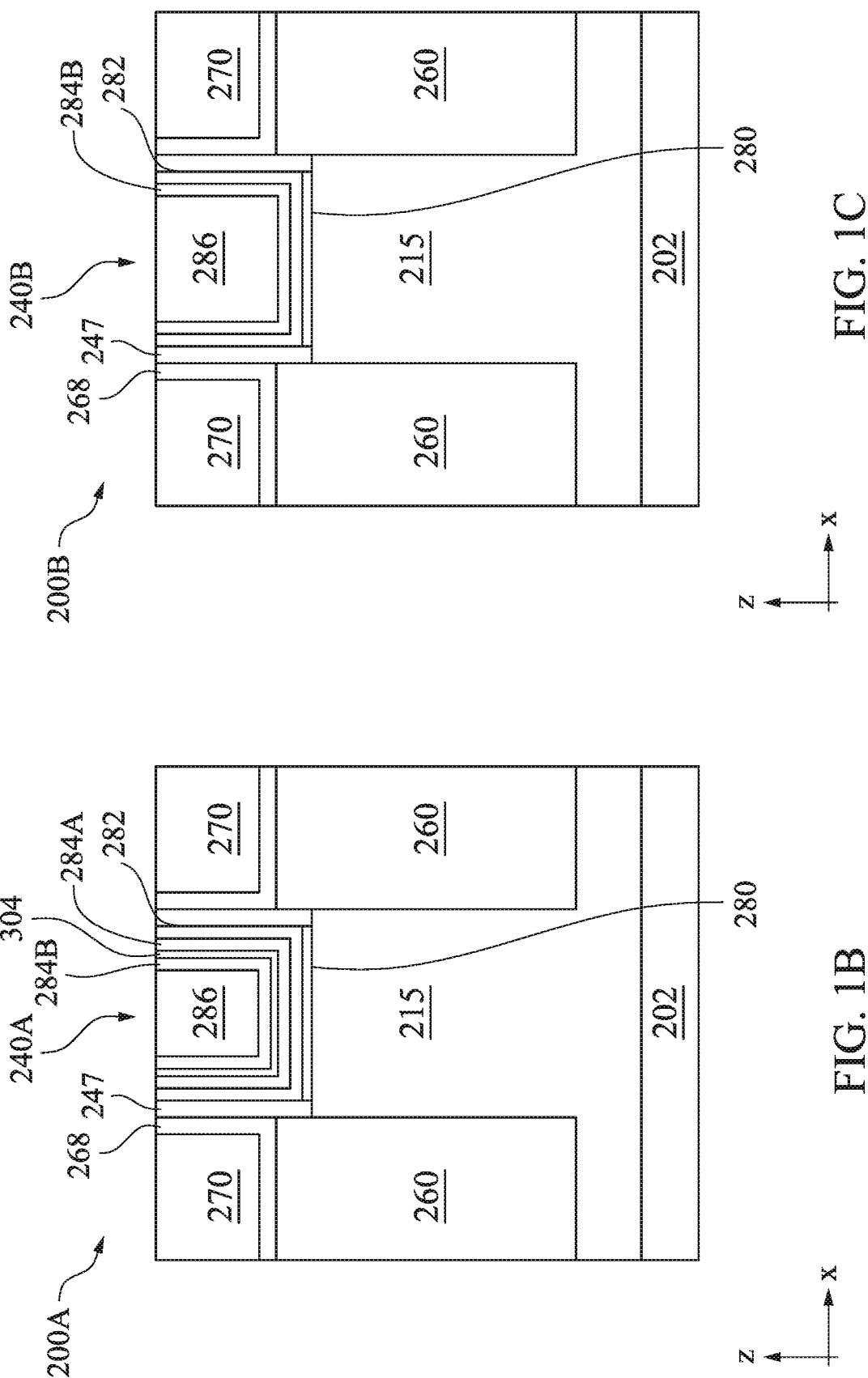

METHOD AND STRUCTURE FOR METAL GATE BOUNDARY ISOLATION

PRIORITY

This is a continuation application of U.S. application Ser. No. 17/233,355, filed Apr. 16, 2021, which claims the benefits to U.S. Provisional Application No. 63/137,569, filed Jan. 14, 2021, each of which is herein incorporated by reference in its entirety.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

One area of advances is how to provide CMOS devices with proper threshold voltages (Vt) for both NMOS and PMOS transistors for boosting performance while reducing power consumption. Particularly, Vt engineering has been challenging as devices continue to scale down to multi-gate devices, such as FinFET, gate-all-around (GAA) devices including nanowire devices and nanosheet devices, and other types of multi-gate devices. An area of improvement is needed in isolating metal gates of adjacent multi-gate devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1B, 1C, and 1D are diagrammatic cross-sectional views of the semiconductor device in FIG. 1A, in portion, along the "B-B," "C-C," and "D-D" line in FIG. 1A, respectively, according to the present disclosure.

FIGS. 3A-1 and 3A-2 are diagrammatic cross-sectional views of the semiconductor device in FIG. 1A, in portion, along the "B-B" and "C-C" lines in FIG. 1A, respectively, at a fabrication stage (such as those associated with the method in FIG. 2) according to an embodiment of the present disclosure.

FIGS. 3A-3, 3B, 3C, 3D, 3E, 3F, 3G, 3H, 3I, and 3J are diagrammatic cross-sectional views of the semiconductor device in FIG. 1A, in portion, along the "D-D" line in FIG. 1A at various fabrication stages (such as those associated with the method in FIG. 2) according to an embodiment of the present disclosure.

DETAILED DESCRIPTION

Figure 1A:
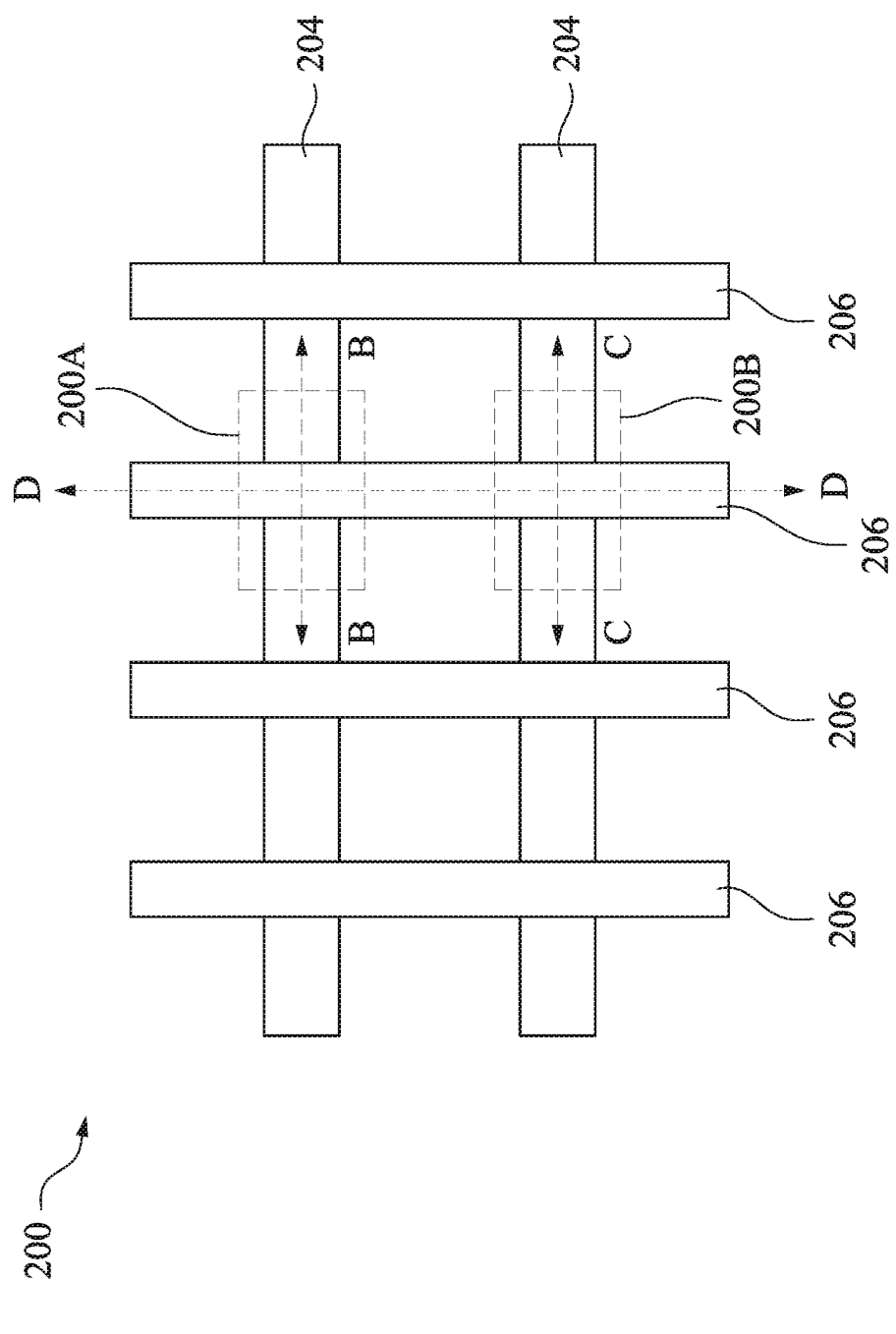
FIG. 1A is a diagrammatic top view of a semiconductor device, in portion, according to the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, from 4.0 nm to 5.0 nm, and so on.

The present disclosure relates generally to semiconductor structures and fabrication processes, and more particularly to providing diffusion barriers (or isolation) between different metal gates (MG) and/or between different metal layers in the same metal gate. With the continued technology scaling and pitch restrictions, multi-threshold voltage (or multi-Vt) devices may be formed by using dipole engineering and/or patterning different work function metal (WFM) layers. However, metals (such as Al and La) from a HKMG (high-k metal gate) of one device might diffuse into a HKMG of an adjacent device. Such diffusion causes $V_t$ non-uniformity in an IC. For example, transistors that are supposed to have the same Vt (for example, standard Vt) by design may have a large variation in their Vt due to such diffusion during manufacturing process or during the operational life of the IC. The present disclosure relates to preventing (or mitigating) the diffusion and intermixing of metal elements in HKMGs.

FIG. 1A shows a diagrammatic top view of a semiconductor device 200, in portion, according to the present disclosure. Referring to FIG. 1A, the device 200 includes active regions 204 (two shown) oriented lengthwise generally along "x" direction and gate regions 206 (four shown) oriented lengthwise generally along "y" direction perpendicular to the "x" direction. Transistors such as field effect transistors (FET) may be formed with the gate regions 206 and the active regions 204. For illustration purposes, FIG. 1A illustrates two FETs, 200A and 200B, in the device 200. The semiconductor device 200 may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs and gate-all-around devices, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 1D:
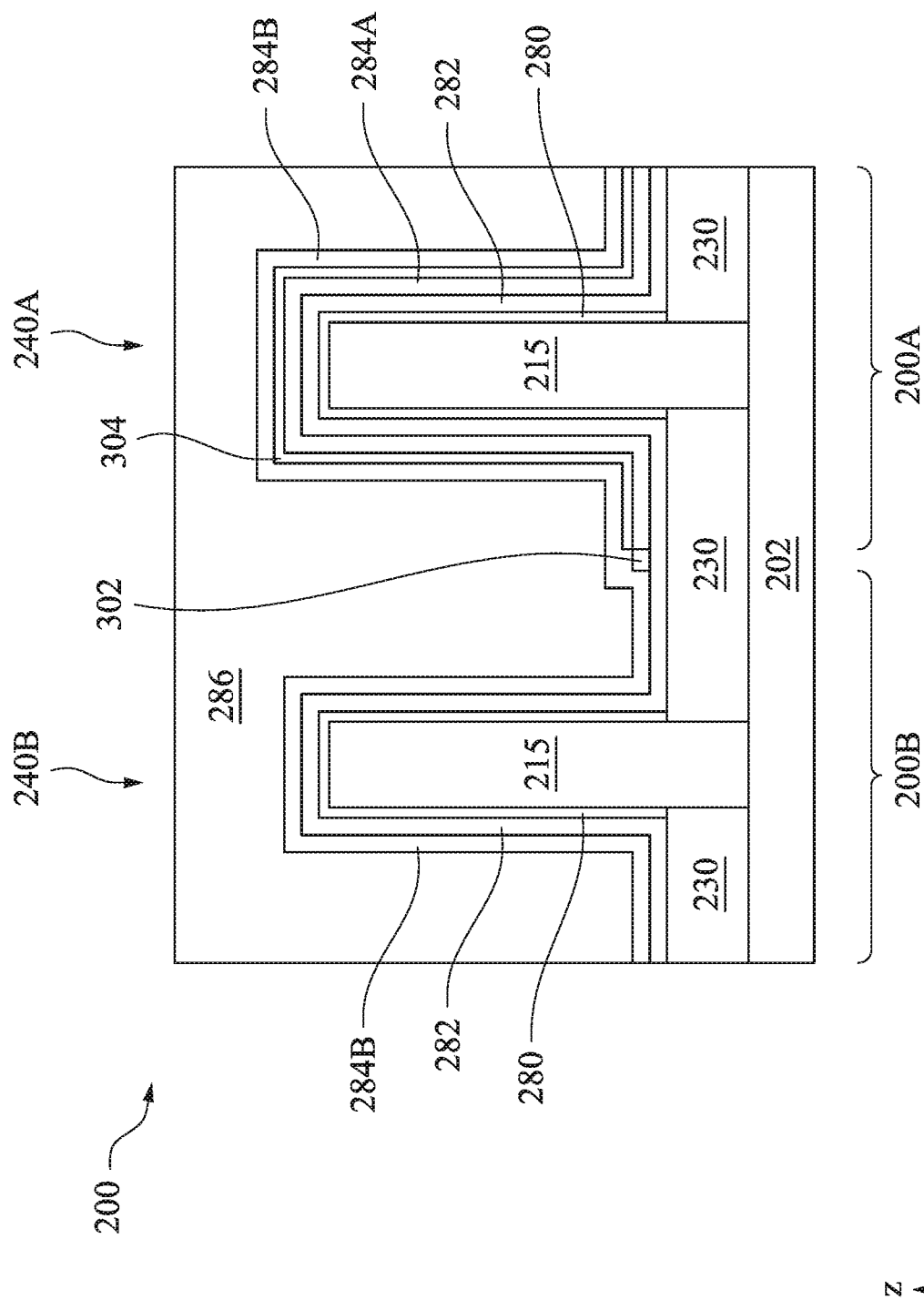

FIGS. 1B, 1C, and 1D are diagrammatic cross-sectional views of the semiconductor device 200, in portion, along the "B-B," "C-C," and "D-D" lines in FIG. 1A, respectively, according to the present disclosure. The embodiments of FETs 200A and 200B illustrated in FIGS. 1B, 1C, and 1D are FinFETs, where their channel layers are in the shape of one or more semiconductor fins 215. In various embodiments, the FETs 200A and 200B can have other configurations. For example, either or both of the FETs 200A and 200B can be a FinFET, a nanowire FET, a nanosheet FET, or a planar FET.

Referring to FIGS. 1B-1D collectively, the device 200 includes a substrate (e.g., a wafer) 202. In the depicted embodiment, the substrate 202 includes silicon. Alternatively, or additionally, the substrate 202 includes another semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, the substrate 202 is a semiconductor-on-insulator substrate, such as a silicon-on-insulator (SOI) substrate, a silicon germanium-on-insulator (SGOI) substrate, or a germanium-on-insulator (GOI) substrate.

Each of the FETs 200A and 200B includes a pair of source/drain features 260. For n-type FET (or NFET), the source/drain features 260 are of n-type. For p-type FET (or PFET), the source/drain features 260 are of p-type. In the depicted embodiment, the source/drain features 260 are higher than the semiconductor channel layer (the fins 215) in the same FET to apply stress to the semiconductor channel layer. The source/drain features 260 may be formed by epitaxially growing semiconductor material(s) (e.g., Si or SiGe) to fill trenches in the device 200, for example, using CVD deposition techniques (e.g., Vapor Phase Epitaxy), molecular beam epitaxy, other suitable epitaxial growth processes, or combinations thereof. The source/drain features 260 are doped with proper n-type dopants and/or p-type dopants. For example, for NFET, the source/drain features 260 may include silicon and be doped with carbon, phosphorous, arsenic, other n-type dopant, or combinations thereof; and for PFET, the source/drain features 260 may include silicon, silicon germanium, or germanium and be doped with boron, other p-type dopant, or combinations thereof. In some embodiments, one of the FETs 200A and 200B is an NFET and the other is a PFET and they collectively form a CMOSFET. In some embodiments, both the FETs 200A and 200B are NFET or both are PFET. In some embodiments, the gate electrodes of the FETs 200A and 200B share some common metal layers, as will be further discussed.

Each of the FETs 200A and 200B further includes one or more semiconductor fins (or simply, fins) 215 extending from the substrate 202 and through isolation features 230. The fins 215 connect the pair of source/drain features 260 and serve as the transistor channels for the respective FET. In the embodiment depicted in FIGS. 1B-1D, each FET 200A and 200B includes a single fin 215. In alternative embodiments, each FET 200A and 200B may include a single fin 215 or multiple fins 215. The fins 215 may have a height (along the "z" direction) about 40 nm to about 70 nm and a width (along the "y" direction) about 4 nm to about 8 nm, for example.

The fins 215 may include crystalline silicon, germanium, silicon germanium, or other suitable semiconductor materials; and may be formed using any suitable methods including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in an embodiment, a sacrificial layer is formed over the substrate 202 and patterned using a photolithography process. Spacers are formed alongside the patterned sacrificial layer using a self-aligned process. The sacrificial layer is then removed, and the remaining spacers, or mandrels, may then be used as a masking element for patterning the fins 215. For example, the masking element may be used for etching recesses into semiconductor layers over or in the substrate 202, leaving the fins 215 on the substrate 202. The etching process may include dry etching, wet etching, reactive ion etching (RIE), and/or other suitable processes.

The device 200 further includes isolation feature(s) 230 to isolate various regions, such as the various active regions 204. The isolation features 230 include silicon oxide, silicon nitride, silicon oxynitride, other suitable isolation material (for example, including silicon, oxygen, nitrogen, carbon, or other suitable isolation constituent), or combinations thereof. In an embodiment, the isolation features 230 are formed by etching trenches in or over the substrate 202 (e.g., as part of the process of forming the fins 215), filling the trenches with an insulating material, and performing a chemical mechanical planarization (CMP) process and/or an etching back process to the insulating material, leaving the remaining insulating material as the isolation features 230. The isolation features 230 can include different structures, such as shallow trench isolation (STI) structures, deep trench isolation (DTI) structures, and/or local oxidation of silicon (LOCOS) structures. The isolation features 230 can include multiple layers of insulating materials.

As shown in FIGS. 1B-1D, the FET 200A includes a gate stack 240A engaging the fin 215 and the FET 200B includes a gate stack 240B engaging another fin 215. The gate stacks 240A and 240B are provided in the gate region 206. The gate stack 240A includes an interfacial layer 280, a gate dielectric layer (such as a high-k gate dielectric layer) 282, a work function metal (WFM) layer 284A, a diffusion barrier 304, another WFM layer 284B, and a bulk metal layer 286. The gate stack 240B includes the interfacial layer 280, the gate dielectric layer 282, the WFM layer 284B, and the bulk metal layer 286.

In an embodiment, the interfacial layer 280 includes a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The gate dielectric layer 282 may include $SiO_2$ in an embodiment. The gate dielectric layer 282 may include $HfO_2$, HfSiO, $HfSiO_4$, HfSiON, HfLaO, HfTaO, HfTiO, HfZrO, HfAlOx, $ZrO_2$, $ZrSiO_2$, AlSiO, $Al_2O_3$, $TiO_2$, LaO, LaSiO, $Ta_2O_3$, $Ta_2O_5$, $Y_2O_3$, $SrTiO_3$, BaZrO, $BaTiO_3$ (BTO), (Ba,Sr)$TiO_3$(BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 282 may be formed by ALD and/or other suitable methods.

In an embodiment, the FETs 200A and 200B have different threshold voltages, which are provided at least in part by the different WFM layers 284A and 284B therein. Each of the WFM layers 284A and 284B may include one layer or multiple layers of metallic materials. Each of the WFM layers 284A and 284B can include an n-type work function metal or a p-type work function metal. Example n-type work function metals include Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. Example p-type work function metals include TIN, TaN, TaSN, Ru, Mo, Al, WN, WCN $ZrSi_2$, $MoSi_2$, $TaSi_2$, $NiSi_2$, other p-type work function material, or combinations thereof. The WFM layers 284A and 284B may be deposited by ALD, CVD, PVD, and/or other suitable process.

Referring to FIG. 1D, the WFM layer 284B of the FET 200B and the WFM layer 284A of the FET 200A are disposed at the same stack level. For example, both are disposed directly on the gate dielectric layer 282 in the depicted embodiment. The device 200 further includes a diffusion barrier 302 disposed laterally between the WFM layer 284B of the FET 200B and the WFM layer 284A of the FET 200A. The diffusion barrier 302 prevents the metal elements of the WFM layers 284A and 284B of the two FETs from intermixing. In the FET 200A, the diffusion barrier 304 is disposed between the WFM layers 284A and 284B and prevents the metal elements of the WFM layers 284A and 284B of the same FET from intermixing. In the present embodiment, the diffusion barrier 304 is conductive. Thus, the layers 284A, 304, 284B, and 286 in the gate stack 240A collectively function as a gate electrode. In embodiments, the diffusion barrier 302 may be conductive or insulative. Formation of the diffusion barriers 302 and 304 will be discussed in detail later.

Having the diffusion barriers 302 and 304 advantageously maintains the threshold voltages of the FETs 200A and 200B during manufacturing processes and throughout the operational life of the device 200. It also improves the uniformity of the threshold voltages of the same type of FETs in the device 200 according to design specification. For example, the device 200 may provide FETs with various threshold voltages (Vt), such as ultra-low Vt, low Vt, standard Vt, high Vt, and so on. The different threshold voltages may be provided using different WFM layers in different FETs or by incorporating different dipole materials in the gate stacks of different FETs. Without the diffusion barriers (such as 302 and 304), the different WFM layers or different dipole materials may diffuse and intermix between different FETs, undesirably causing variations in the FETs' threshold voltages to be out of design specification. For example, aluminum, a common metal for work function engineering, is known to diffuse through various materials. Without the diffusion barriers (such as 302 and 304), aluminum in a WFM layer of a gate stack is likely to diffuse into an adjacent WFM layer of the same gate stack or another gate stack. Such diffusion of aluminum would alter the intended work function of the gate stack, thus altering the intended Vt of the FET. Having the diffusion barriers 302 and 304 solves the above problems.

The bulk metal layer 286 may include a metal such as aluminum (Al), tungsten (W), cobalt (Co), copper (Cu), and/or other suitable materials; and may be deposited using plating, CVD, PVD, or other suitable processes. In the embodiment shown in FIG. 1D, the gate stacks 240A and 240B share some common metal layers such as the WFM layer 284B and the bulk metal layer 286 and these common metal layers electrically connect the gate stacks 240A and 240B. In various embodiments, the gate stacks 240A and 240B may share at least one common metal layer or does not share any common metal layer (i.e., not electrically connected by a common metal layer).

Referring to FIGS. 1B-1C, the device 200 further includes gate spacers 247 over sidewalls of the gate stacks 240A and 240B. The gate spacers 247 may include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacers 247 include a multi-layer structure, such as a first dielectric layer that includes silicon nitride and a second dielectric layer that includes silicon oxide. The gate spacers 247 may be formed by deposition (e.g., CVD, PVD. ALD, etc.) and etching processes (e.g., dry etching).

The device 200 further includes a contact etch stop layer (CESL) 268 disposed over the isolation features 230, the source/drain features 260, and the gate spacers 247. The CESL 268 includes silicon and nitrogen, such as silicon nitride or silicon oxynitride. The CESL 268 may be formed by a deposition process, such as CVD, or other suitable methods. The device 200 further includes an inter-layer dielectric (ILD) layer 270 over the CESL 268. The ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. The ILD layer 270 may be formed by a deposition process, such as CVD, flowable CVD (FCVD), or other suitable methods.

Figure 2:
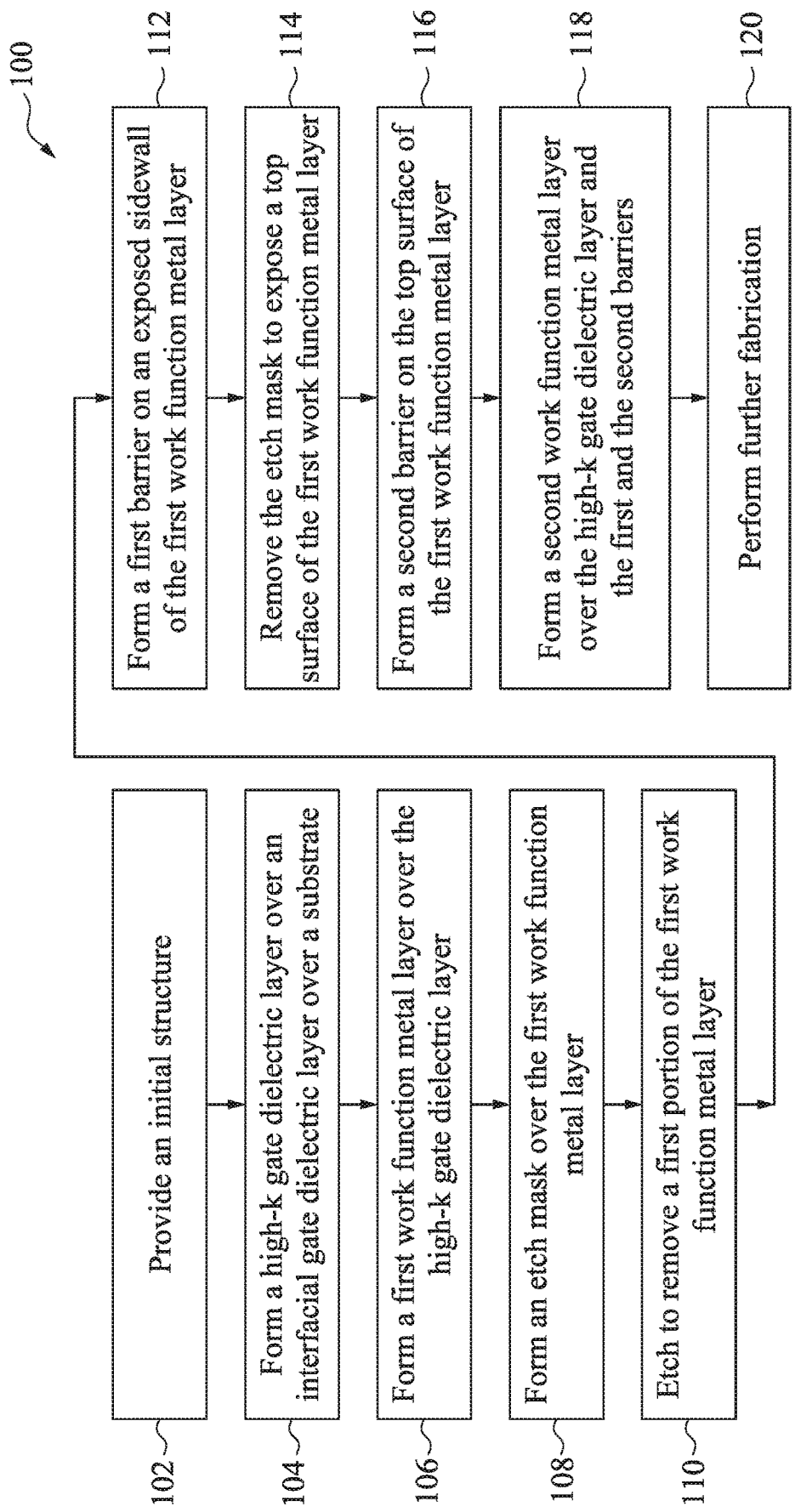
FIG. 2 is a flow chart of a method for fabricating a semiconductor device according to various aspects of the present disclosure.

FIG. 2 is a flow chart of a method 100 for fabricating an embodiment of the device 200 according to various aspects of the present disclosure. Additional processing is contemplated by the present disclosure. Additional steps can be provided before, during, and after the method 100, and some of the steps described can be moved, replaced, or eliminated for additional embodiments of the method 100. The method 100 is described below in conjunction with FIGS. 3A-1 through 3J. FIGS. 3A-1, 3A-2, and 3A-3 are diagrammatic cross-sectional views of the device 200, in portion, along the "B-B," "C-C," and "D-D" lines, respectively, in FIG. 1A. FIGS. 3B-3J are diagrammatic cross-sectional views of the device 200, in portion, along the "D-D" line in FIG. 1A at various fabrication stages associated with the method 100 in FIG. 2.

At the operation 102, the method 100 (FIG. 2) provides an initial structure (or a workpiece) of the device 200, such as shown in FIGS. 3A-1, 3A-2, and 3A-3. The device 200 includes substrate 202, fins 215, source/drain features 260, gate spacers 247, CESL 268, and ILD 270, as discussed above. The fins 215 are exposed in a gate trench 275 which is resulted from the removal of a dummy gate from a gate region 206 (FIG. 1A).

Figures 1, 3A:
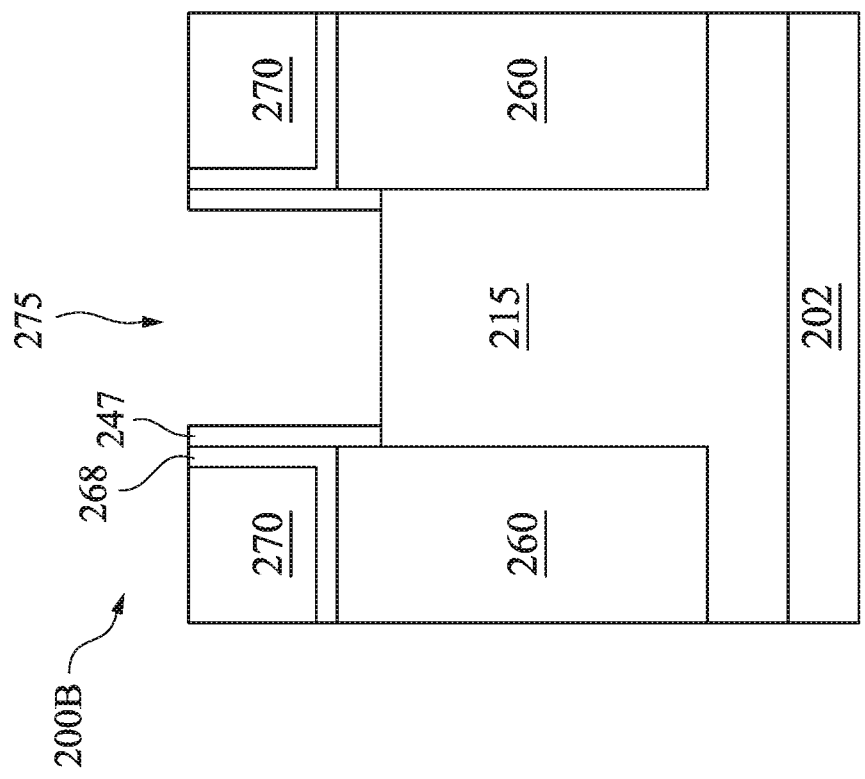
Figures 2, 3A:
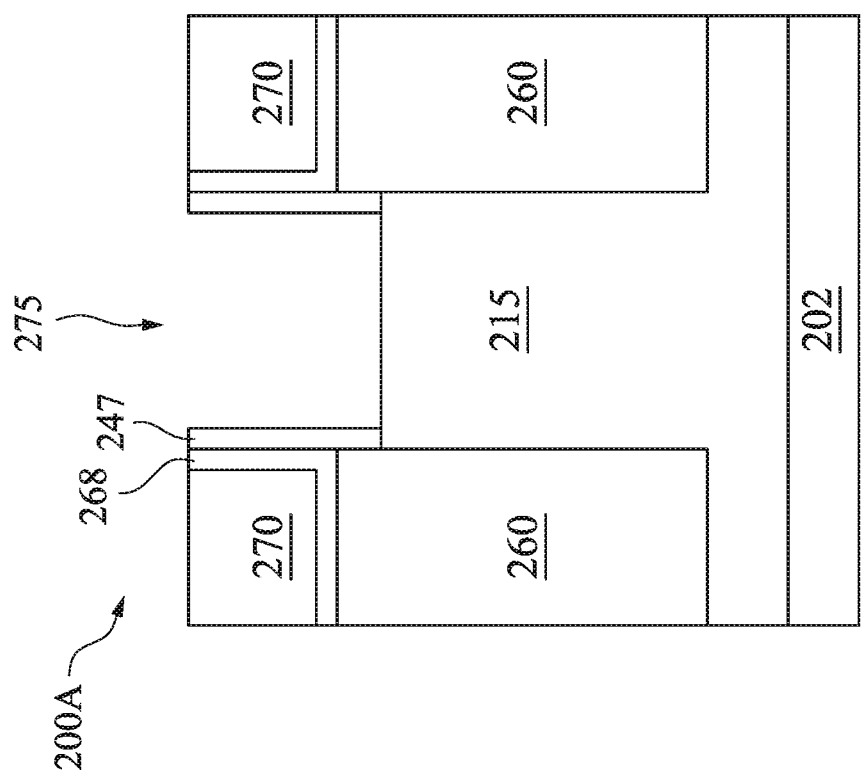
Figures 3, 3A:
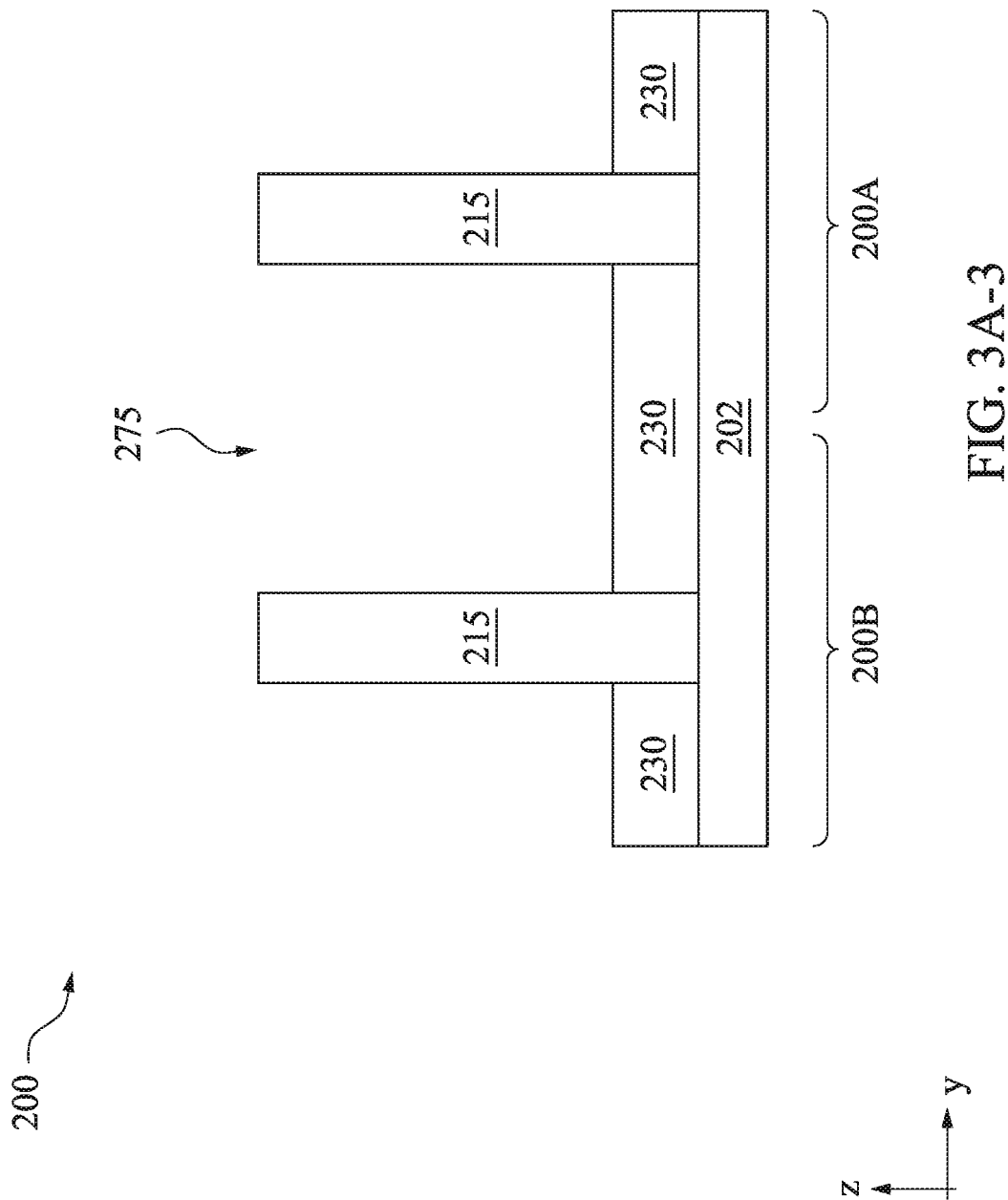
Figure 3B:
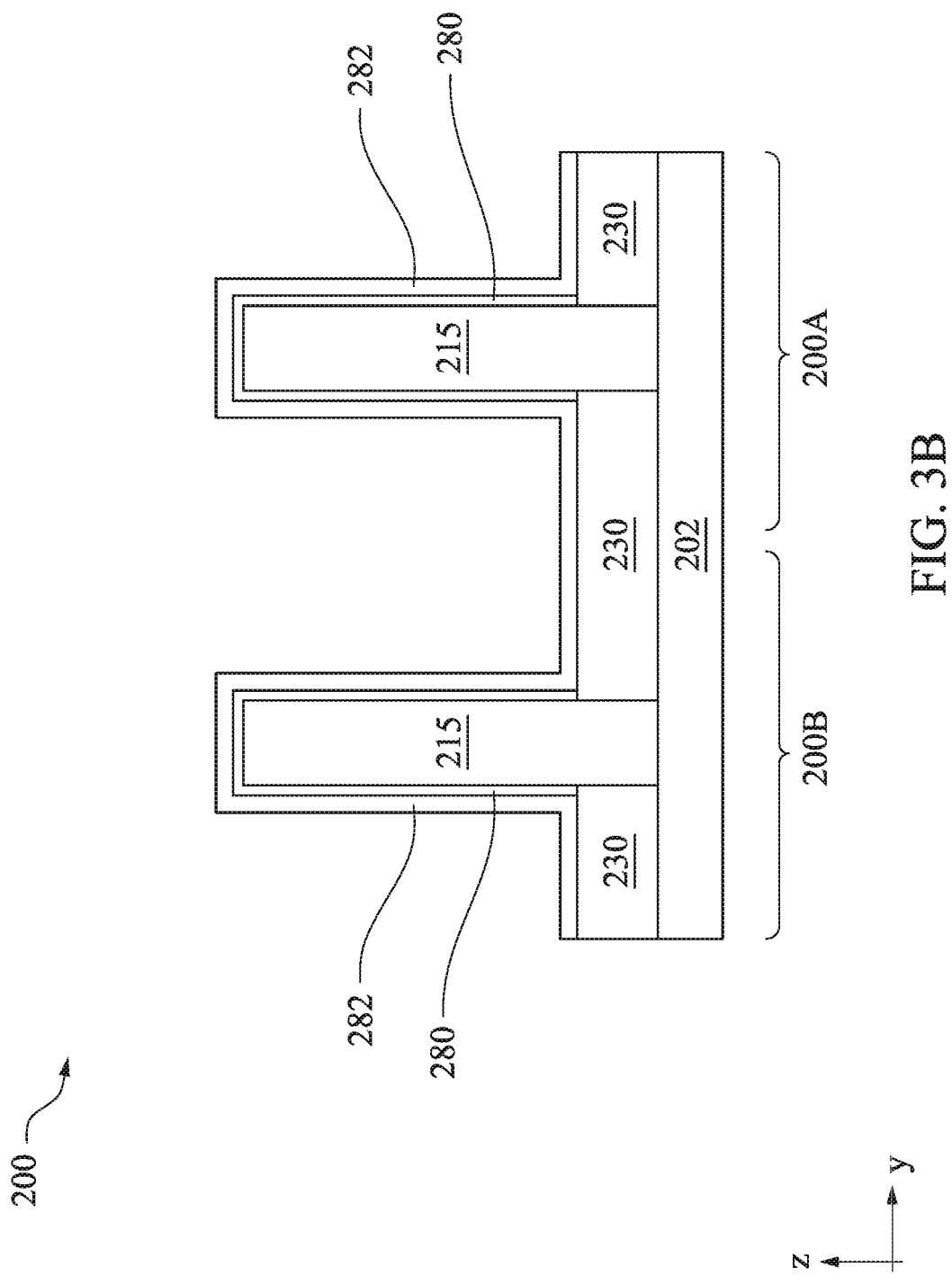

At the operation 104, the method 100 (FIG. 2) forms an interfacial gate dielectric layer (or simply, interfacial layer) 280 over the fins 215 and form a gate dielectric layer (such as a high-k (or HK) gate dielectric layer) 282 over the interfacial layer 280, such as shown in FIG. 3B. Turning to FIG. 3B, in the depicted embodiment, the interfacial layer 280 is disposed on surfaces of the fins 215, but not on the isolation features 230. For example, the interfacial layer 280 may be formed by oxidizing semiconductor material(s) in the fins 215, which does not produce the interfacial layer 280 on the isolation features 230. In some embodiments, the interfacial layer 280 is also disposed on the isolation features 230, for example, by atomic layer deposition (ALD) of a dielectric material as the interfacial layer 280. The interfacial layer 280 includes a dielectric material, such as $SiO_2$, HfSiO, SiON, other silicon-containing dielectric material, other suitable dielectric material, or combinations thereof. The interfacial layer 280 is formed by any of the processes described herein, such as thermal oxidation, chemical oxidation, ALD, CVD, other suitable process, or combinations thereof. The interfacial layer 280 may have a thickness of about 0.5 nm to about 1.5 nm, for example. In alternative embodiments, the interfacial layer 280 may be omitted in the FETs 200A and 200B.

The gate dielectric layer 282 is disposed over the interfacial layer 280 and the isolation features 230. The gate dielectric layer 282 includes $HfO_2$ in an embodiment. In another embodiment, the gate dielectric layer 282 includes another hafnium-containing high-k dielectric material, such as $HfSiO_4$, HfSiON (nitrided hafnium silicate), lanthanum hafnium oxide (such as $Hf_2La_2O_7$), HfTaO, HfTiO, HfZrO, hafnium-aluminum-oxide (i.e., HfAlOx), or hafnium dioxide-alumina ($HfO_2$—$Al_2O_3$) alloy. In another embodiment, the gate dielectric layer 282 includes another high-k dielectric material such as $ZrO_2$, $ZrSiO_4$, $Al_2SiO_5$, $Al_2O_3$, $TiO_2$, $La_2O_3$, $La_4Si_3O_{12}$, $Ta_2O_3$, $Ta_2O_5$, $Y_2O_3$, $SrTiO_3$, $BaZrO_3$, $BaTiO_3$(BTO), (Ba,Sr)$TiO_3$(BST), or combinations thereof. The gate dielectric layer 282 is formed by any of the processes described herein, such as ALD, CVD. PVD, oxidation-based deposition process, other suitable process, or combinations thereof. The gate dielectric layer 282 may have a thickness of about 0.2 nm to about 1.5 nm, for example.

Figure 3C:
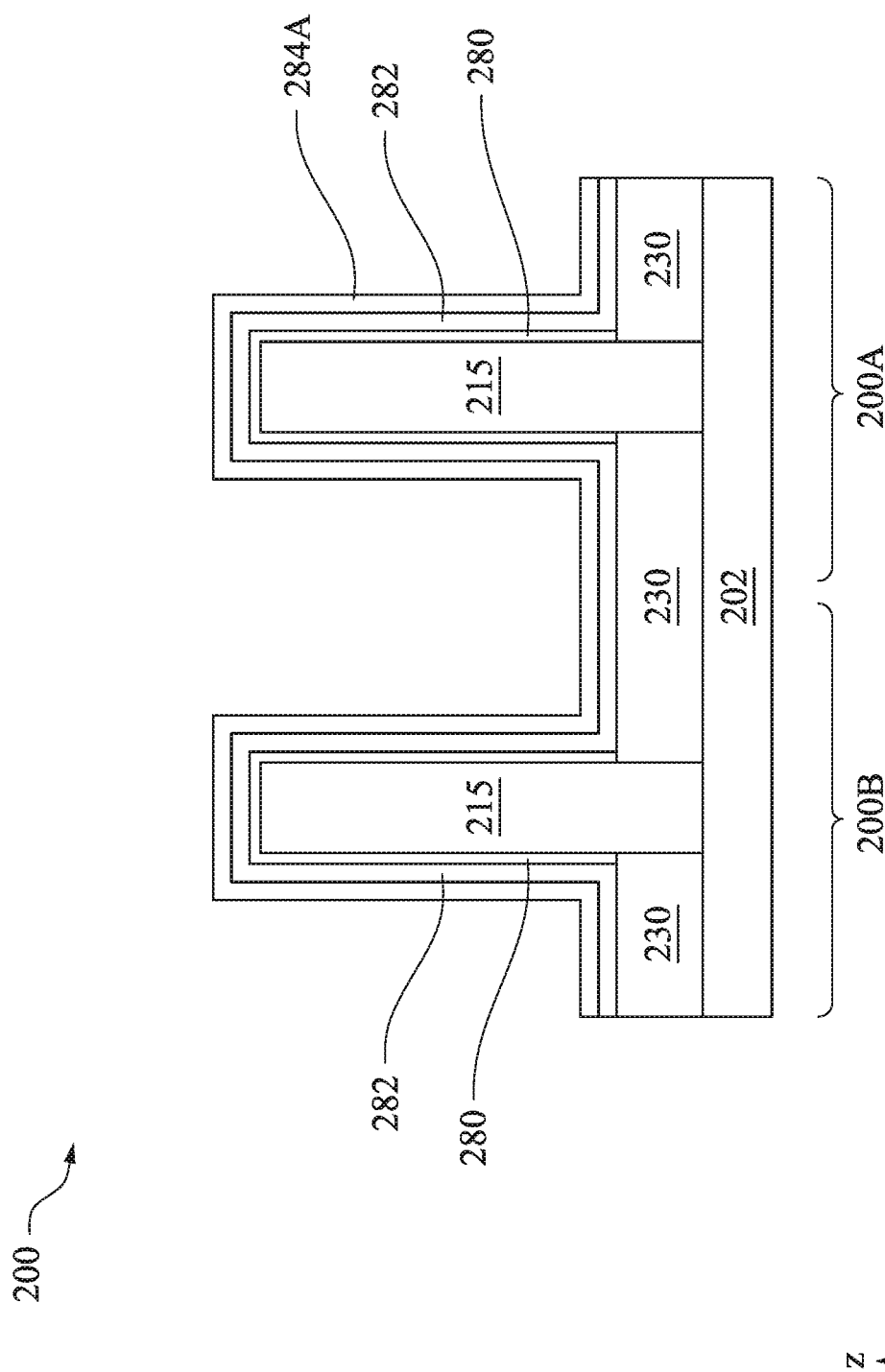

At the operation 106, the method 100 (FIG. 2) forms a work function metal (WFM) layer 284A over the gate dielectric layer 282, such as shown in FIG. 3C. In an embodiment, the WFM layer 284A includes TiN. In some embodiments, the WFM layer 284A includes another nitride-based metallic material, such as TaN, WN, TiCN, TaCN, WCN, TiAlN, or TaAlN. In some embodiments, the WFM layer 284A may include TiAlC. TiAlSiC, TaC, TaAl, TaAlC, TaSiAlC, or other suitable work function metal. In some examples, the WFM layer 284A has a thickness of about 1 nm to about 2.5 nm, such as from about 1 nm to about 1.5 nm. The WFM layer 284A is formed by any of the processes described herein, such as ALD, CVD, PVD, other suitable process, or combinations thereof. The WFM layer 284A may include one layer of material or multiple layers of materials.

Figure 3D:
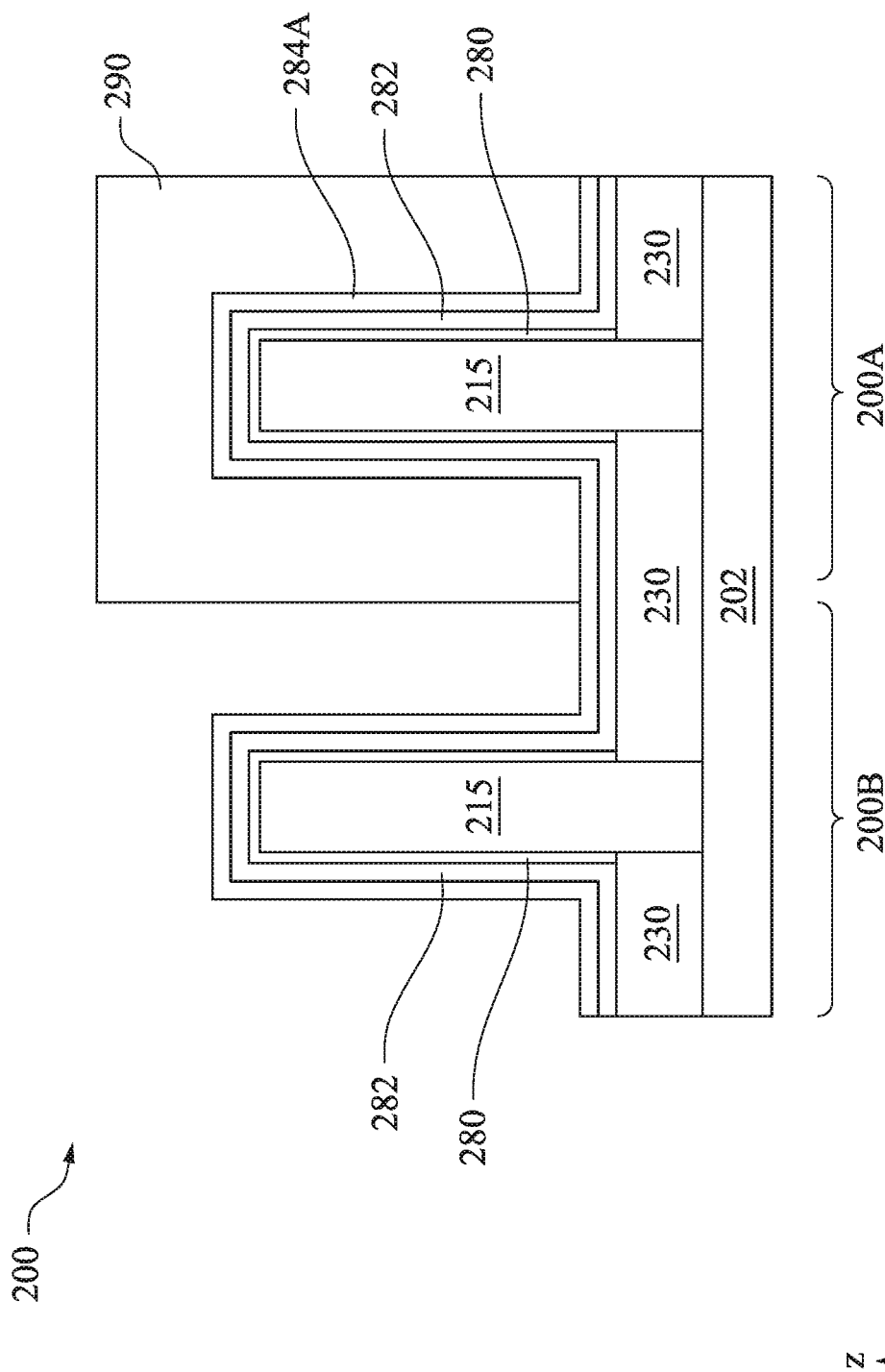

At the operation 108, the method 100 (FIG. 2) forms an etch mask 290 that covers the area for the FET 200A and exposes the area for the FET 200B, such as shown in FIG. 3D. The mask 290 includes a material that is different than a material of the WFM layer 284A and the gate dielectric layer 282 to achieve etching selectivity during the etching of the WFM layer 284A and during the removal of the etch mask 290. For example, the mask 290 may include a resist material (and thus may be referred to as a patterned resist layer and/or a patterned photoresist layer). In some embodiments, the mask 290 has a multi-layer structure, such as a resist layer disposed over an anti-reflective coating (ARC) layer. The present disclosure contemplates other materials for the mask 290, so long as the above etching selectivity is achieved. In some embodiments, the operation 108 includes a lithography process that includes forming a resist layer over the device 200 (e.g., by spin coating), performing a pre-exposure baking process, performing an exposure process using a photomask, performing a post-exposure baking process, and developing the exposed resist layer in a developer solution. After development, the patterned resist layer (e.g., patterned mask 290) includes a resist pattern that corresponds with the photomask. Alternatively, the exposure process can be implemented or replaced by other methods, such as maskless lithography, e-beam writing, ion-beam writing, or combinations thereof.

Figure 3E:
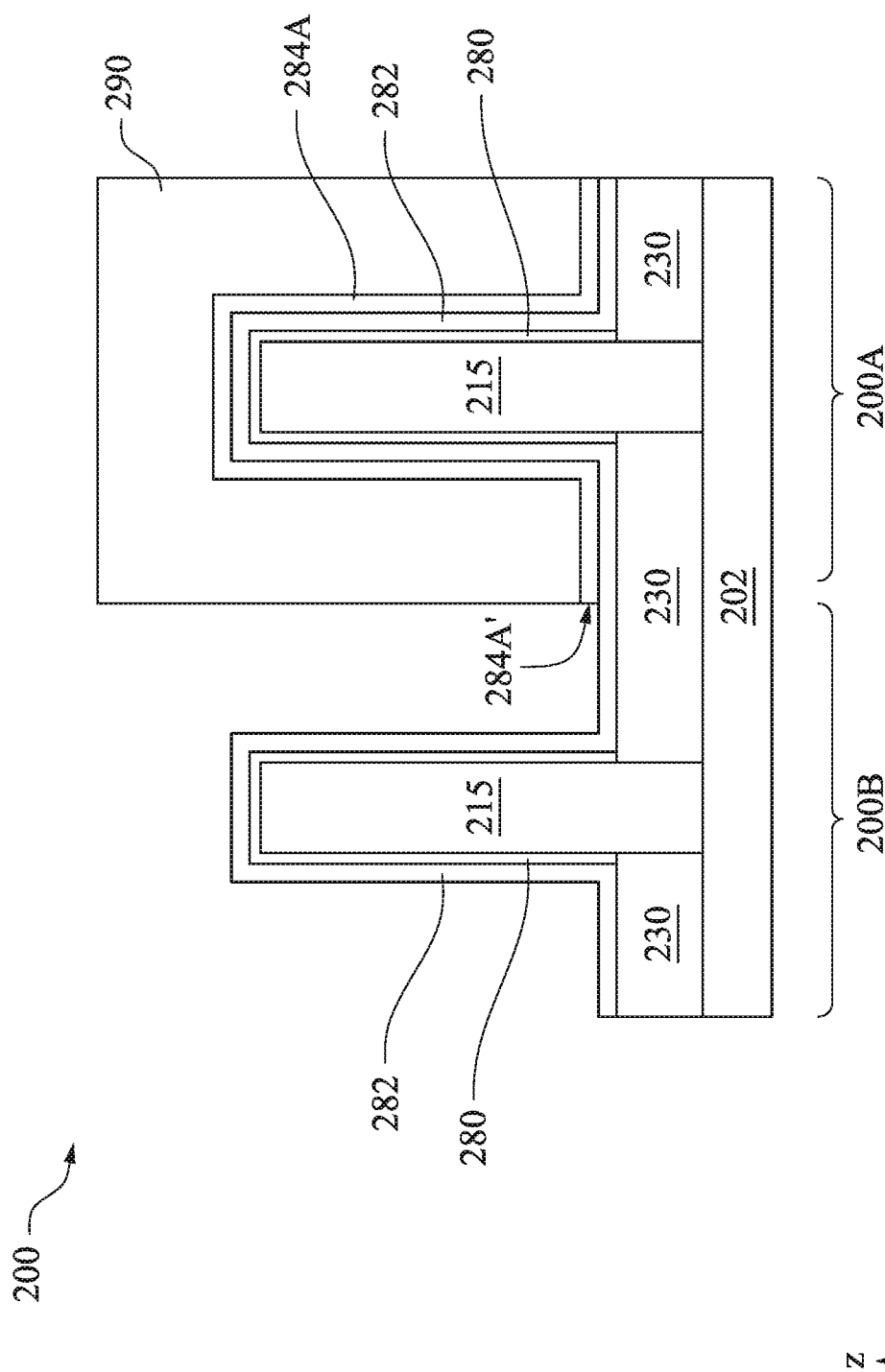

At the operation 110, with the etch mask 290 in place, the method 100 (FIG. 2) etches the WFM layer 284A and removes it from the transistor 200B, such as shown in FIG. 3E. The gate dielectric layer 282 in the transistor 200B and a sidewall 284A' of the WFM layer 284A are exposed after the etching finishes. The etching process can be a dry etching process, a wet etching process, or a reactive ion etching process that has a high etching selectivity with respect to the WFM layer 284A relative to the gate dielectric layer 282. Thus, the gate dielectric layer 282 is not etched or insignificantly etched by the operation 110. In some embodiments, the etching process further has an etching selectivity with respect to WFM layer 284A relative to the mask 290. In some embodiments, the etching process partially etches the mask 290.

Figure 3F:
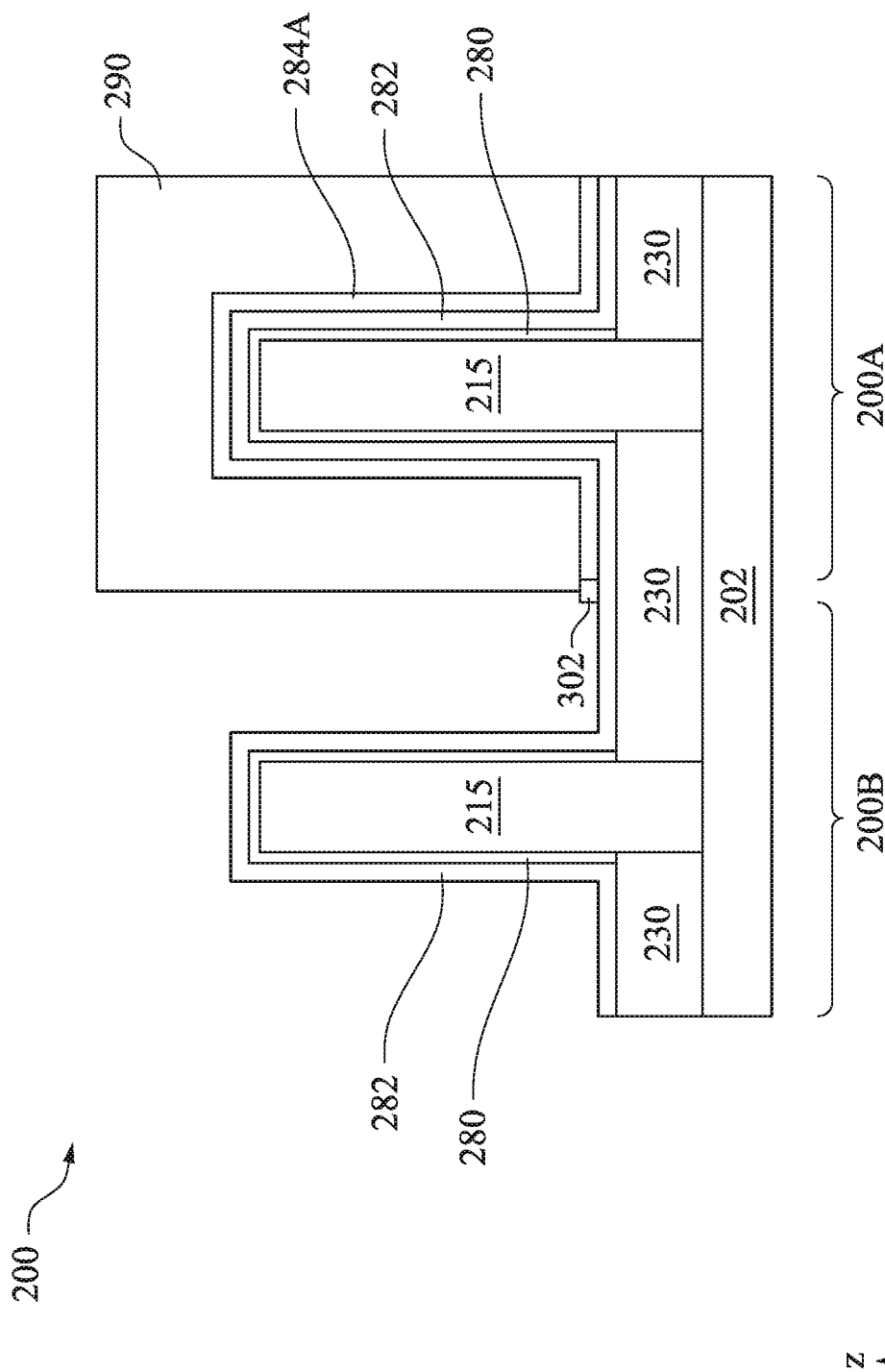

At the operation 112, with the etch mask 290 or at least a part thereof still in place, the method 100 (FIG. 2) forms a diffusion barrier (or simply, barrier) 302 on the exposed sidewall of the 284A' of the WFM layer 284A, such as shown in FIG. 3F. The barrier 302 is not formed on the gate dielectric layer 282 of the FET 200B. The barrier 302 is formed such that it prevents or substantially blocks chemical elements (such as Al) from diffusing into the WFM layer 284A in the FET 200A. In other words, the barrier 302 has low permeability for aluminum and/or other chemical elements that may adversely affect the WFM layer 284A in the FET 200A. The following disclosure discusses three ways of forming the barrier 302. Alternative ways of forming the barrier 302 are also contemplated.

In a first embodiment, the operation 112 forms the barrier 302 by applying an oxidizing agent to the sidewall 284A'. The oxidizing agent reacts with the elements in the sidewall 284A' and forms an oxide compound as the barrier 302. For example, the oxidizing agent may include $H_2O_2$ or ozonized DIW (de-ionized water). The composition of the barrier 302 depends on the material of the WFM layer 284A. In some embodiments, the barrier 302 may include TIO, TION, TiAlO, WO, WCO, WCNO, RuO, WON, TaO, TaCO, TaAlO TaTiO, TiOH, WOH, AlOH, TaOH, or a combination thereof. The oxidizing agent does not react with the gate dielectric layer 282. Thus, the barrier 302 is not formed on the gate dielectric layer 282. In some instances, the oxidizing agent helps to improve the quality of the gate dielectric layer 282 by re-oxidizing it or by reducing the O-vacancies in the gate dielectric layer 282. For example, oxygen from the oxidizing agent may diffuse into the gate dielectric layer 282 and repair dangling bonds therein. In some embodiments, the barrier 302 has a thickness of about 0.5 nm to about 10 nm. If the barrier 302 is too thin (such as less than 0.5 nm), it may not effectively block aluminum or other elements from diffusing into the WFM layer 284A. If the barrier 302 is too thick (such as more than 10 nm), it may take up too much space and leave too little space for the WFM layer 284A for the FET 200A and the WFM layer 284B for the FET 200B (see FIG. 3I). This would go against the downscaling of the device 200.

In a second embodiment, the operation 112 forms the barrier 302 by selectively depositing a tungsten-containing layer on the sidewall 284A' as the barrier 302. The tungsten-containing layer is not deposited on the gate dielectric layer 282. Thus, the deposition is selective. For example, the operation 112 may form the tungsten-containing layer using a precursor having $WCl_5$ and $H_2$ with $B_2H_6$ as a reducing agent. Alternatively, the operation 112 may form the tungsten-containing layer using a precursor having $WCl_5$ and $H_2$ with $SiH_4$ as a reducing agent. Alternatively, the operation 112 may form the tungsten-containing layer using a gas mixture of $WF_6$ and $SiH_4$. Alternatively, the operation 112 may form the tungsten-containing layer using a gas mixture of $WF_6$ and $H_2$. In another embodiment, the operation 112 may form the tungsten-containing layer using a precursor having Bis(dimethyl amido-W). The deposition may be performed at a temperature that is in a range of about 150° C. to about 450° C. at a pressure about 10 torr to 350 torr. In this embodiment, the barrier 302 may include W, WC, WCN, WCl, WF, WB. WS, or a combination thereof; and may have a thickness in a range of about 0.5 nm to about 10 nm. The significance of this thickness has been discussed with reference to the first embodiment above.

In a third embodiment, the operation 112 forms the barrier 302 by selectively treating the sidewall 284A' of the WFM layer 284A with fluorine (F) radicals. For example, fluorine radicals may be generated from $F_2$, $CF_4$, $NF_3$, other fluorine-containing gases, or a combination thereof. The fluorine radicals react with the sidewall 284A' (or a thin outer layer of the WFM layer 284A) to produce a fluorinated barrier 302. In this embodiment, the barrier 302 includes the material(s) of the WFM layer 284A and fluorine. It has been demonstrated that aluminum has strong affinity for fluorine. Thus, the fluorine elements in the barrier 302 can bond with aluminum elements that may come from other layers (such as the WFM layer 284B) and prevent the aluminum elements from diffusing into the WFM layer 284A. In this embodiment, the barrier 302 may have a thickness in a range of about 0.5 nm to about 10 nm. The significance of this thickness has been discussed with reference to the first embodiment above.

Figure 3G:
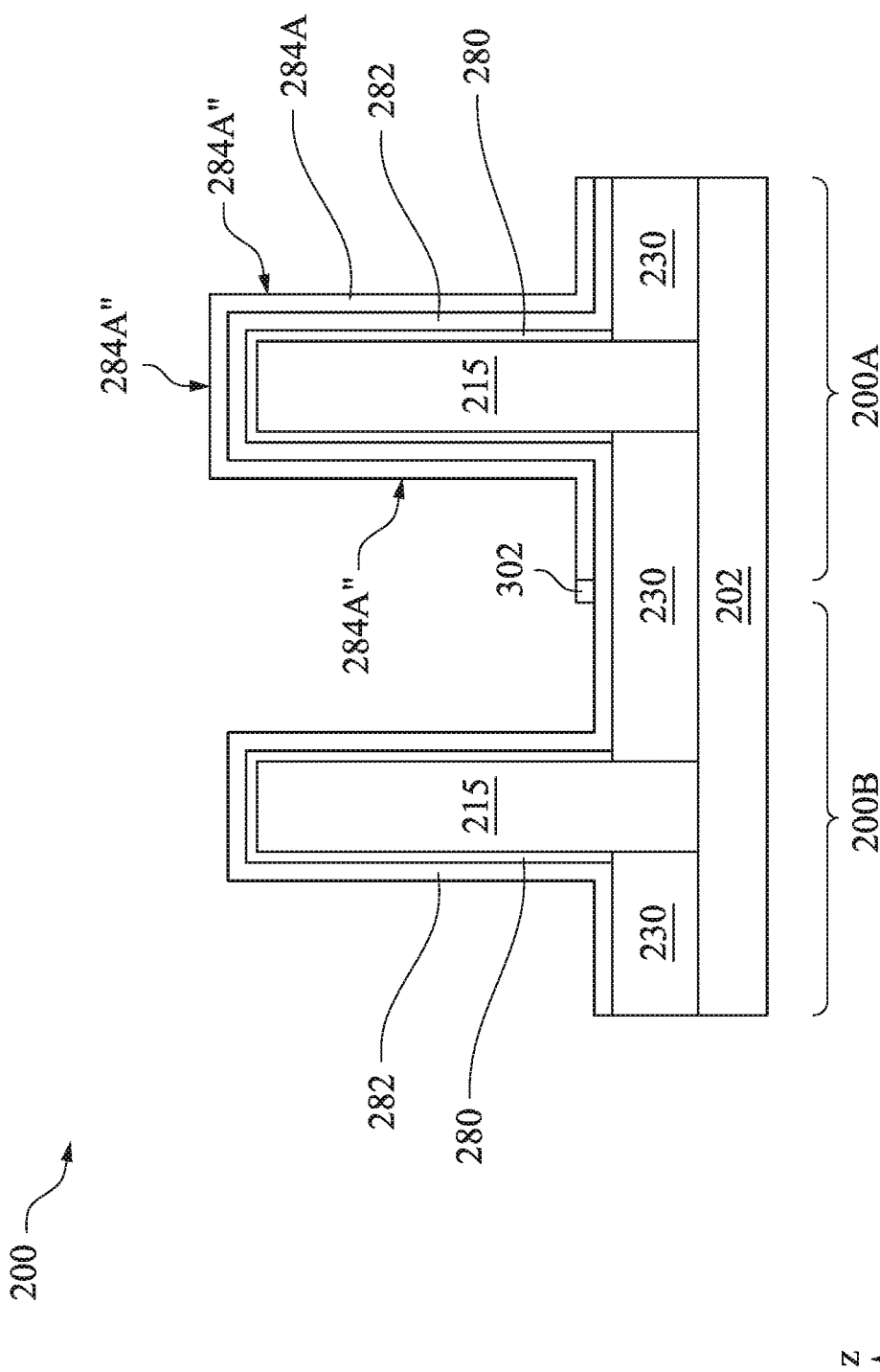

At the operation 114, the method 100 (FIG. 2) removes the etch mask 290, for example, by a resist stripping process or other suitable process. As shown in FIG. 3G, an outer surface (including a top surface) 284A" of the WFM layer 284A is exposed after the etch mask 290 is removed.

Figure 3H:
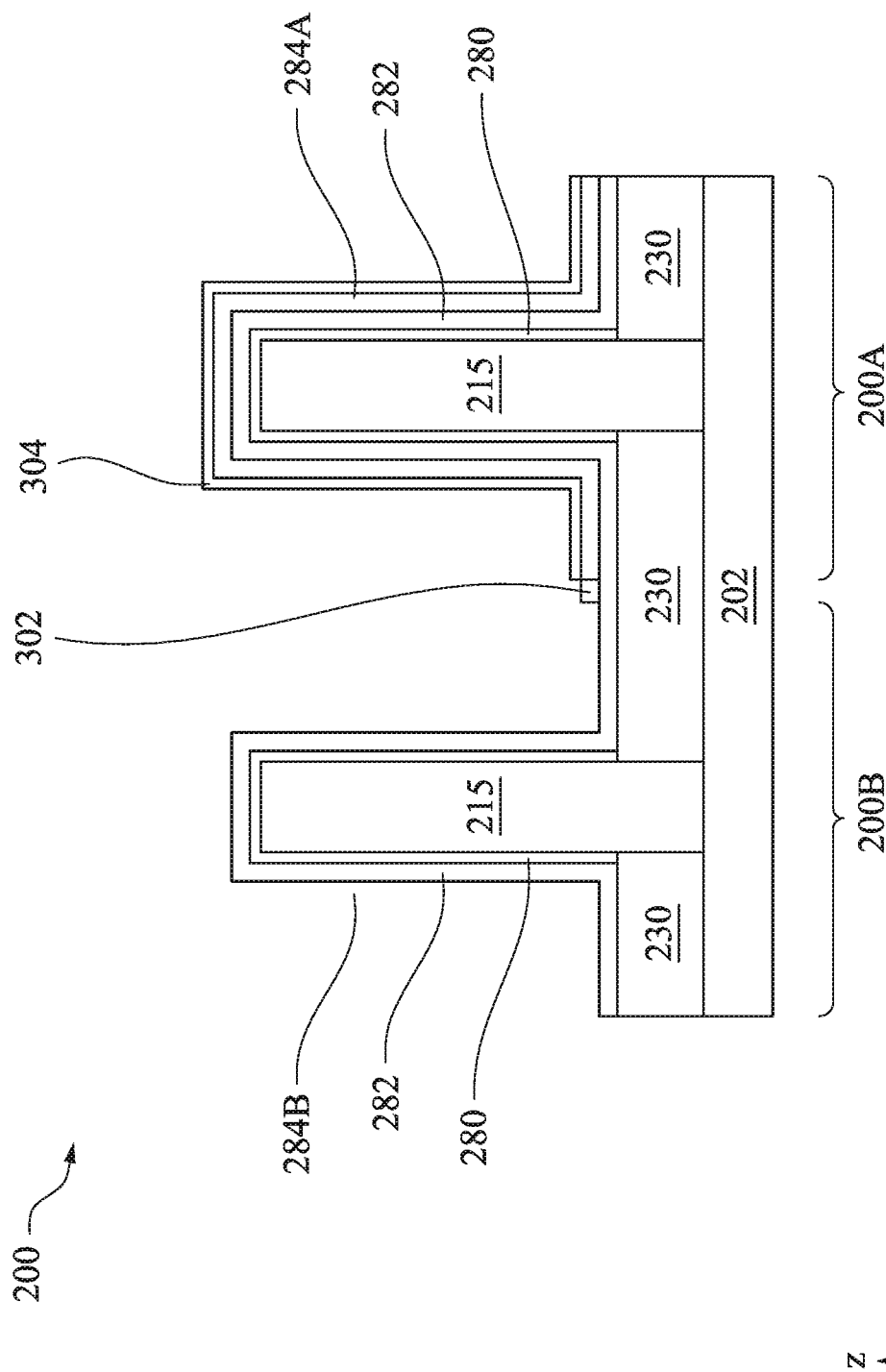

At the operation 116, the method 100 (FIG. 2) selectively forms a diffusion barrier (or simply, barrier) 304 on the exposed outer surface 284A" of the WFM layer 284A, such as shown in FIG. 3H. The barrier 304 is not formed on the gate dielectric layer 282 of the FET 200B. The barrier 304 is formed such that it prevents or substantially blocks chemical elements (such as Al) from diffusing into the WFM layer 284A in the FET 200A. In other words, the barrier 304 has low permeability for aluminum and/or other chemical elements that may adversely affect the WFM layer 284A in the FET 200A. Further, the barrier 304 is conductive, making it part of the gate electrode for the FET 200A. The following disclosure discusses two ways of forming the barrier 304. Alternative ways of forming the barrier 304 are also contemplated.

In a first embodiment, the operation 116 forms the barrier 304 by selectively depositing a tungsten-containing layer on the outer surface 284A" as the barrier 304. The tungsten-containing layer is not deposited on the gate dielectric layer 282. Thus, the deposition is selective. This embodiment of the operation 116 can be the same as the second embodiment of the operation 112. For example, the operation 116 may form the tungsten-containing layer using a precursor having $WCl_5$ and $H_2$ with either $B_2H_6$ or $SiH_4$ as a reducing agent, a precursor having $WF_6$ and $H_2$, a precursor having $WF_6$ and $SiH_4$, or a precursor having Bis(dimethyl amido-W). The deposition may be performed at a temperature that is in a range of about 150° C. to about 450° C. at a pressure about 10 torr to 350 torr. In this embodiment, the barrier 304 may include W, WC. WCN, WCl, WF, WB, WS, or a combination thereof; and may have a thickness in a range of about 0.5 nm to about 10 nm. The significance of this thickness has been discussed with reference to the first embodiment of the operation 112 above. In an embodiment, the barrier 302 and the barrier 304 are formed to have different thicknesses. In an alternative embodiment, the barrier 302 and the barrier 304 are formed to have the same thickness.

In a second embodiment, the operation 116 forms the barrier 304 by selectively treating the outer surface 284A" with fluorine (F) radicals. This embodiment of the operation 116 can be the same as the third embodiment of the operation 112. For example, fluorine radicals may be generated from $F_2$, $CF_4$, $NF_3$, other fluorine-containing gases, or a combination thereof. The fluorine radicals react with the outer surface 284A" (or a thin outer layer of the WFM layer 284A) to produce a fluorinated barrier 304. In this embodiment, the barrier 304 includes the material(s) of the WFM layer 284A and fluorine. In this embodiment, the barrier 304 may have a thickness in a range of about 0.5 nm to about 10 nm. The significance of this thickness has been discussed above.

In some embodiments, the barriers 302 and 304 include different materials. For example, the barrier 302 may be formed using the first embodiment of the operation 112 (thus, the barrier 302 includes an oxide compound), and the barrier 304 includes either a tungsten-containing layer or a fluorine-containing layer as discussed above with reference to the operation 116. For another example, the barrier 302 includes a tungsten-containing layer, and the barrier 304 includes a fluorine-containing layer. For yet another example, the barrier 302 includes a fluorine-containing layer, and the barrier 304 includes a tungsten-containing layer. In some embodiments, the barriers 302 and 304 include the same materials although they are formed separately. For example, both may include a tungsten-containing layer or a fluorine-containing layer.

Figure 3I:
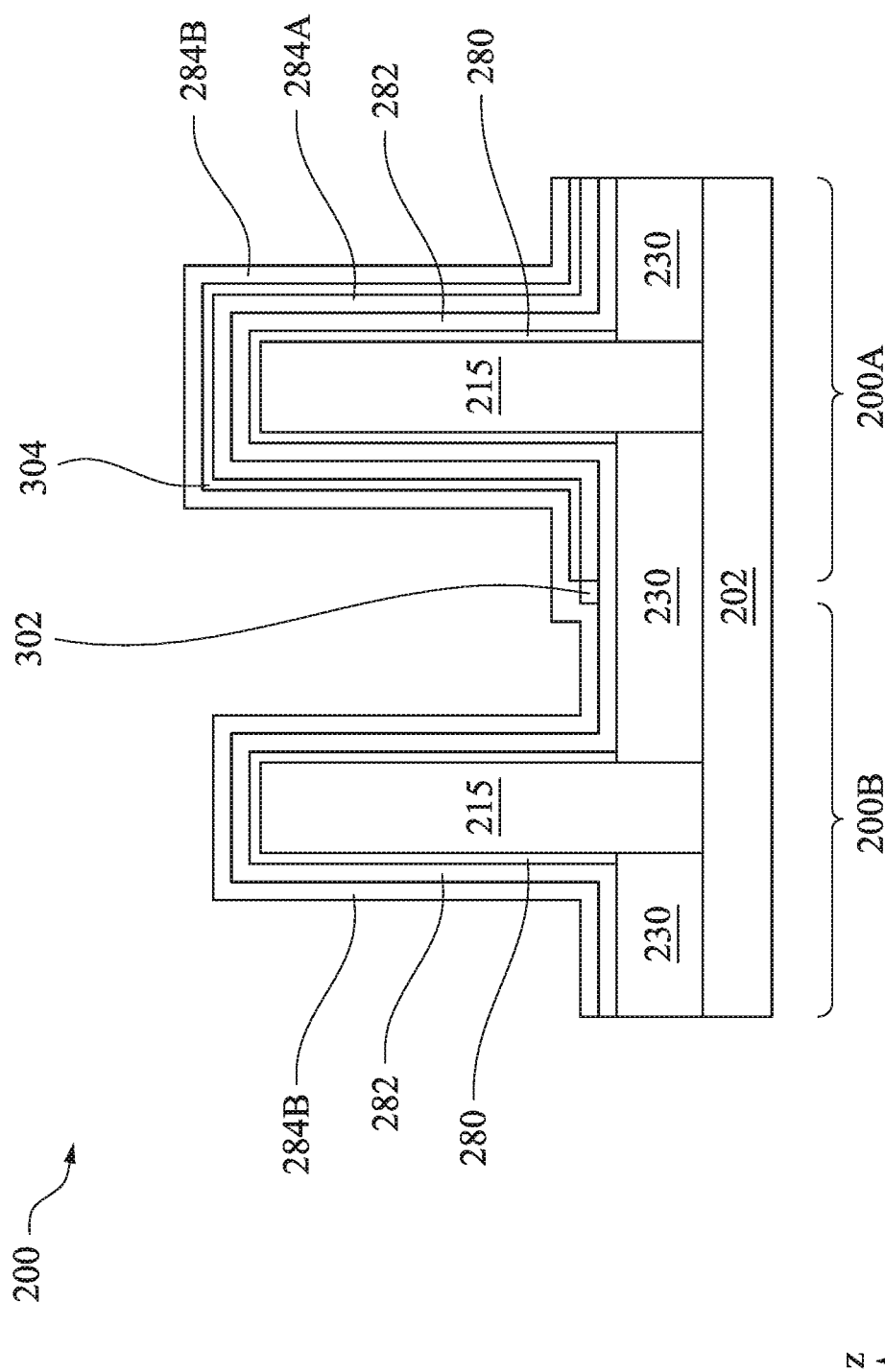

At operation 118, the method 100 (FIG. 2) forms another work function metal (WFM) layer 284B over the gate dielectric layer 282 in the FET 200B and over the barrier 304 in the FET 200A, such as shown in FIG. 3I. The WFM layer 284B is also deposited over the barrier 302. The barrier 302 is disposed horizontally between a portion of the WFM layer 284B for the FET 200B and a portion of the WFM layer 284A for the FET 200A. In an embodiment, the barrier 302 directly contacts the portion of the WFM layer 284B for the FET 200B and the portion of the WFM layer 284A for the FET 200A. The barrier 304 is sandwiched between a portion of the WFM layer 284B for the FET 200A and the WFM layer 284A for the FET 200A. In an embodiment, the barrier 304 directly contacts the portion of the WFM layer 284B for the FET 200A and the WFM layer 284A for the FET 200A. The barriers 302 and 304 separate (but may not insulate) the WFM layer 284A from the WFM layer 284B. The WFM layers 284A and 284B include different materials. In an embodiment, the WFM layer 284B includes aluminum. For example, the WFM layer 284B may include TiAlN, TaAlN, TiAl, TiAlC, TiAlSiC, TaAl, TaAlC, or TaSiAlC. The barriers 302 and 304 block aluminum in the WFM layer 284B from diffusing into the WFM layer 284A. The WFM layer 284B may include other elements in alternative embodiments. In some examples, the WFM layer 284B has a thickness of about 1 nm to about 2.5 nm, such as from about 1 nm to about 1.5 nm. The WFM layer 284B is formed by any of the processes described herein, such as ALD, CVD, PVD, other suitable process, or combinations thereof. The WFM layer 284B may include one layer of material or multiple layers of materials.

Figure 3J:
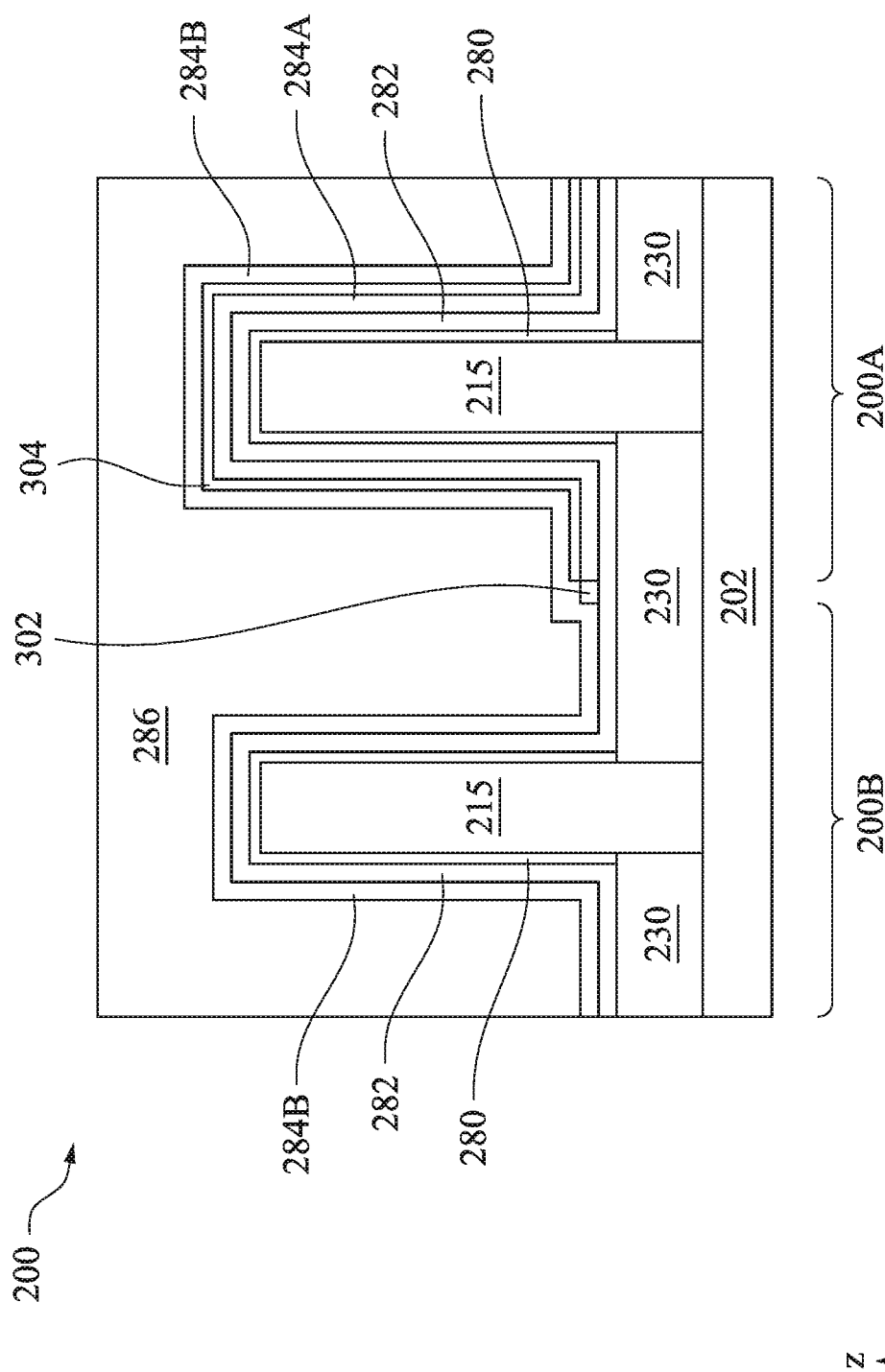

At operation 120, the method 100 (FIG. 2) forms a bulk metal layer 286 over the WMF layer 284B in the FETs 200A and 200B, such as shown in FIG. 3J. For example, a CVD process or a PVD process deposits the bulk metal layer 286, such that it fills any remaining portion of the gate trenches 275 (see FIGS. 3A-1, 3A-2, and 3A-3). The bulk metal layer 286 includes a suitable conductive material, such as Al, W, and/or Cu. The bulk metal layer 286 may additionally or collectively include other metals, metal oxides, metal nitrides, other suitable materials, or combinations thereof. In some implementations, one or more WFM layers (not shown) are formed (e.g., by ALD) over the WFM layers 284A and 284B before forming the bulk metal layer 286. In some implementations, a blocking layer (not shown) is formed (e.g., by ALD) over the WFM layers 284A and 284B before forming the bulk metal layer 286, such that the bulk metal layer 286 is disposed on the blocking layer. After the bulk metal layer 286 is deposited, a planarization process may then be performed to remove excess gate materials from the device 200. For example, a CMP process is performed until a top surface of the ILD layer 270 is reached (exposed).

At operation 122, the method 100 (FIG. 2) performs further fabrications such as forming contacts that electrically connect to the source/drain features 260, forming gate vias that electrically connect to the bulk metal layer 286, and forming multi-layer interconnects that connect the transistors 200A and 200B to various parts of the device 200 to form a complete IC.

Figure 4:
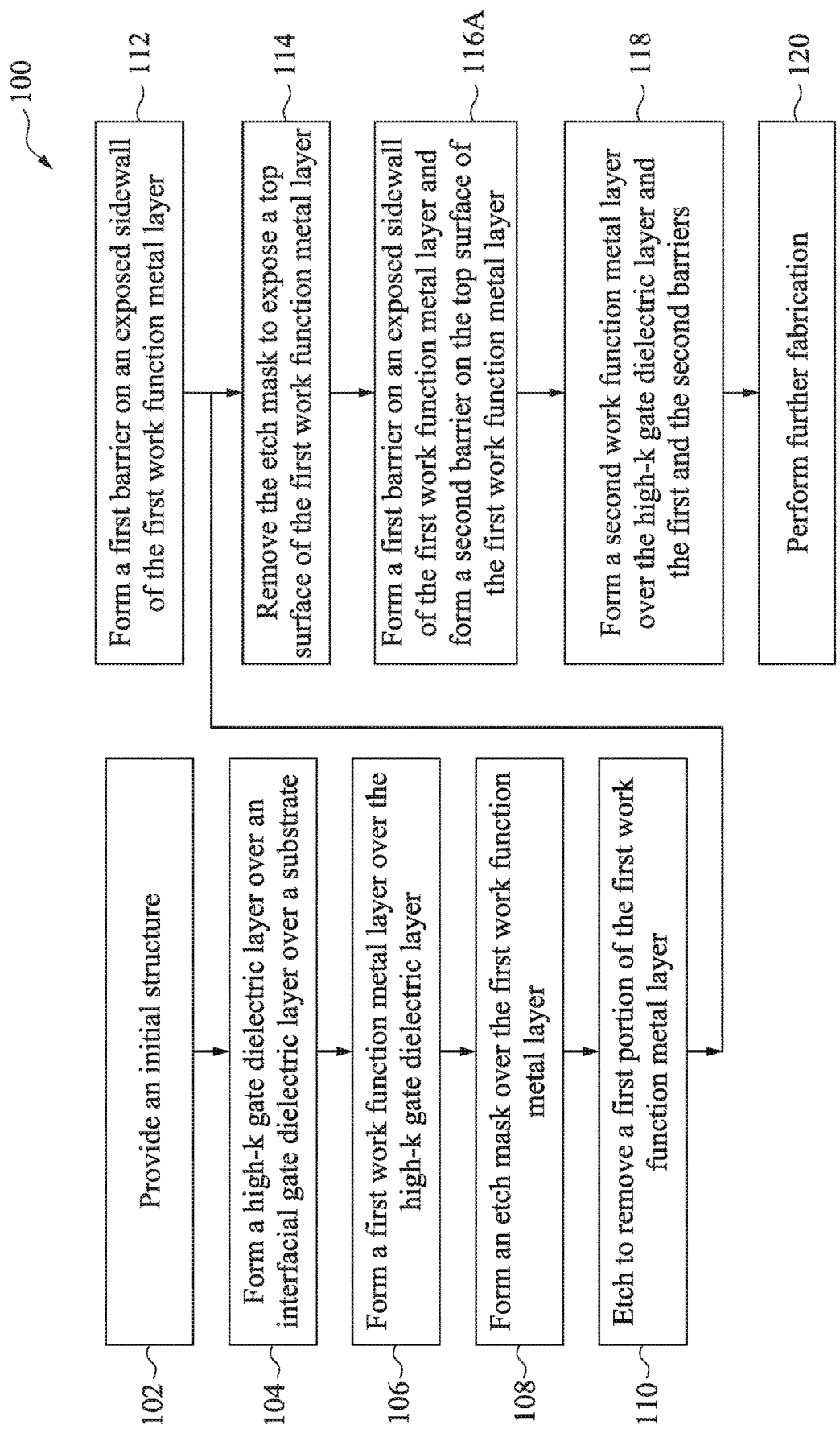
FIG. 4 is a flow chart of a method for fabricating a semiconductor device according to another embodiment of the present disclosure.
Figure 5A:
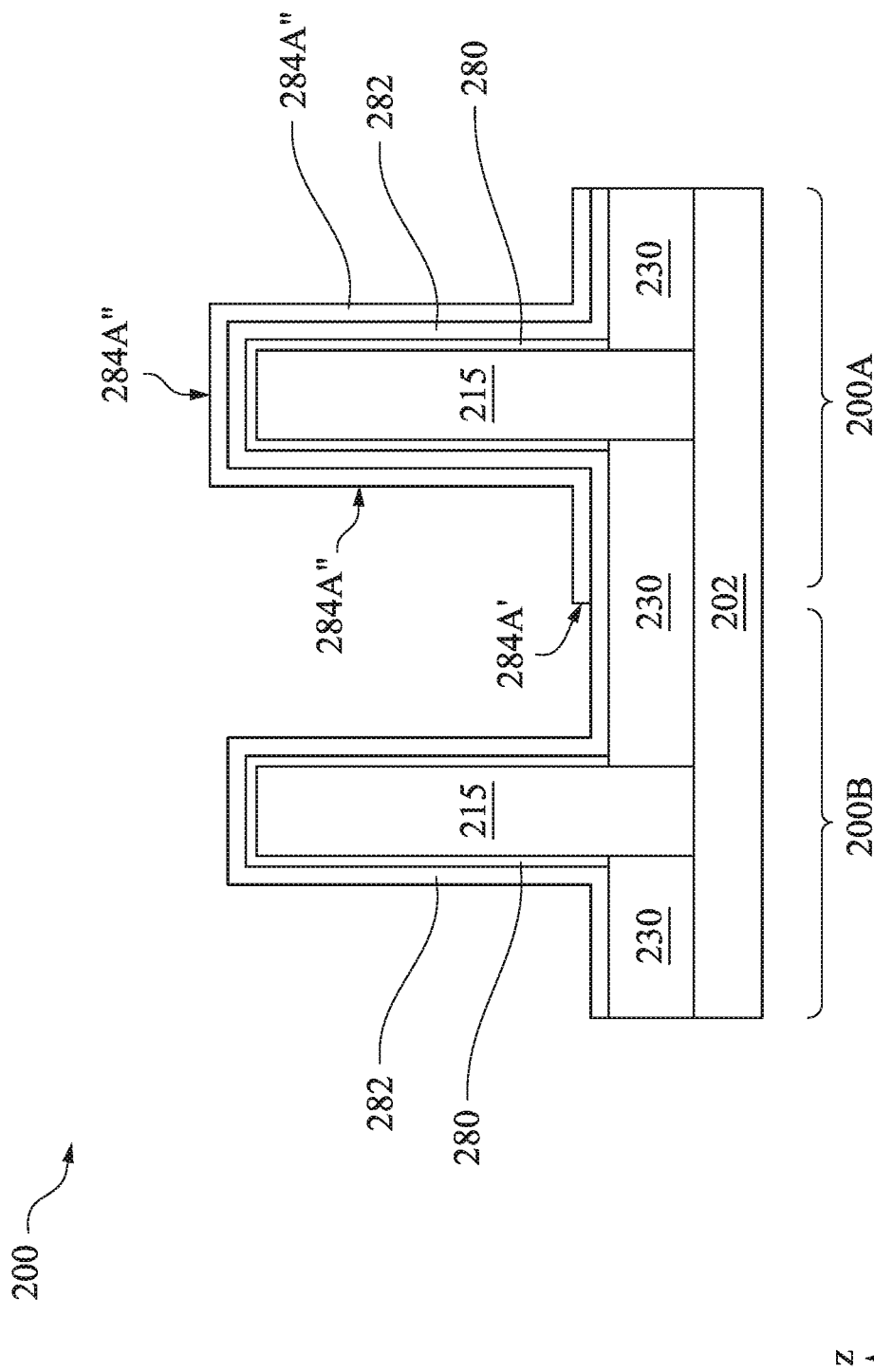
FIGS. 5A and 5B are diagrammatic cross-sectional views of the semiconductor device in FIG. 1A, in portion, along the "D-D" line in FIG. 1A at various fabrication stages (such as those associated with the method in FIG. 4) according to an embodiment of the present disclosure.
Figure 5B:
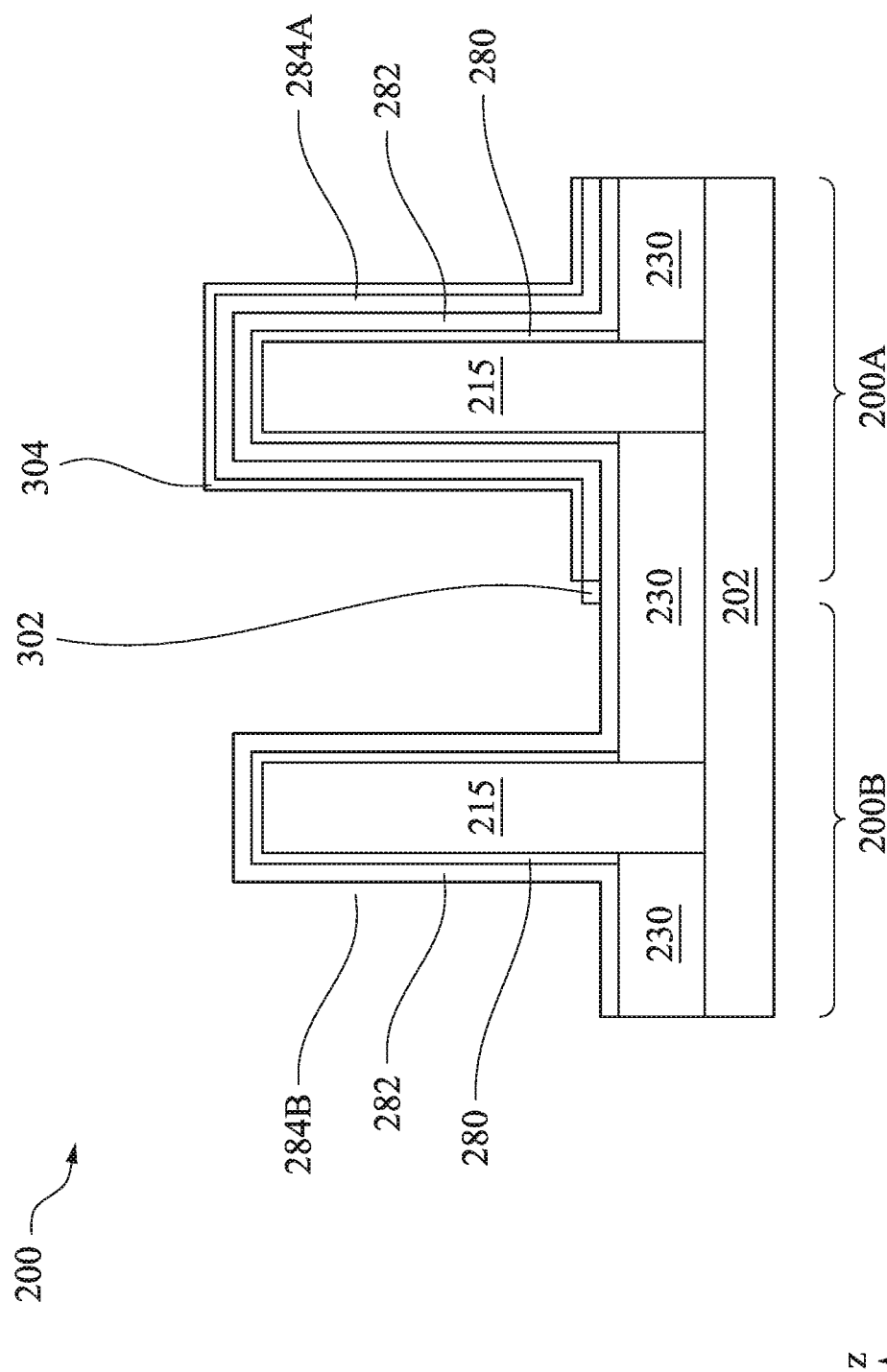

FIG. 4 is a flow chart of another embodiment of the method 100. In this embodiment, the method 100 (FIG. 4) skips (or omits) the operation 112 and proceeds from the operation 110 to the operation 114. At the operation 114, the method 100 (FIG. 4) removes the etch mask 290, as discussed above. The resultant structure is shown in FIG. 5A, where the sidewall surface 284A' and other outer surfaces 284A" are exposed. Then, the method 100 (FIG. 4) proceeds to operation 116A to form the barriers 302 and 304 simultaneously on the surfaces 284A' and 284A". The resultant structure is shown in FIG. 5B. The barrier 302 is formed on the sidewall 284A' and the barrier 304 is formed on other outer surfaces 284A". The operation 116A is the same as the operation 116 discussed with reference to FIG. 2 except that it processes more surfaces than operation 116 does. For example, in a first embodiment, the operation 116A forms the barriers 302 and 304 by selectively depositing a tungsten-containing layer on the exposed surfaces 284A' and 284A" of the WFM layer 284A, which is similar to the first embodiment of the operation 116. In a second embodiment, the operation 116A forms the barriers 302 and 304 by selectively treating the exposed surfaces 284A' and 284A" of the WFM layer 284A with fluorine (F) radicals, which is similar to the second embodiment of the operation 116. In this embodiment of the method 100, the barriers 302 and 304 include the same material. For example, both may include a tungsten-containing layer or a fluorine-containing layer depending on which embodiment of the operation 116A is used. After finishing the operation 116A, the method 100 (FIG. 4) proceeds to the operation 118, as discussed with reference to FIG. 2.

Figure 6:
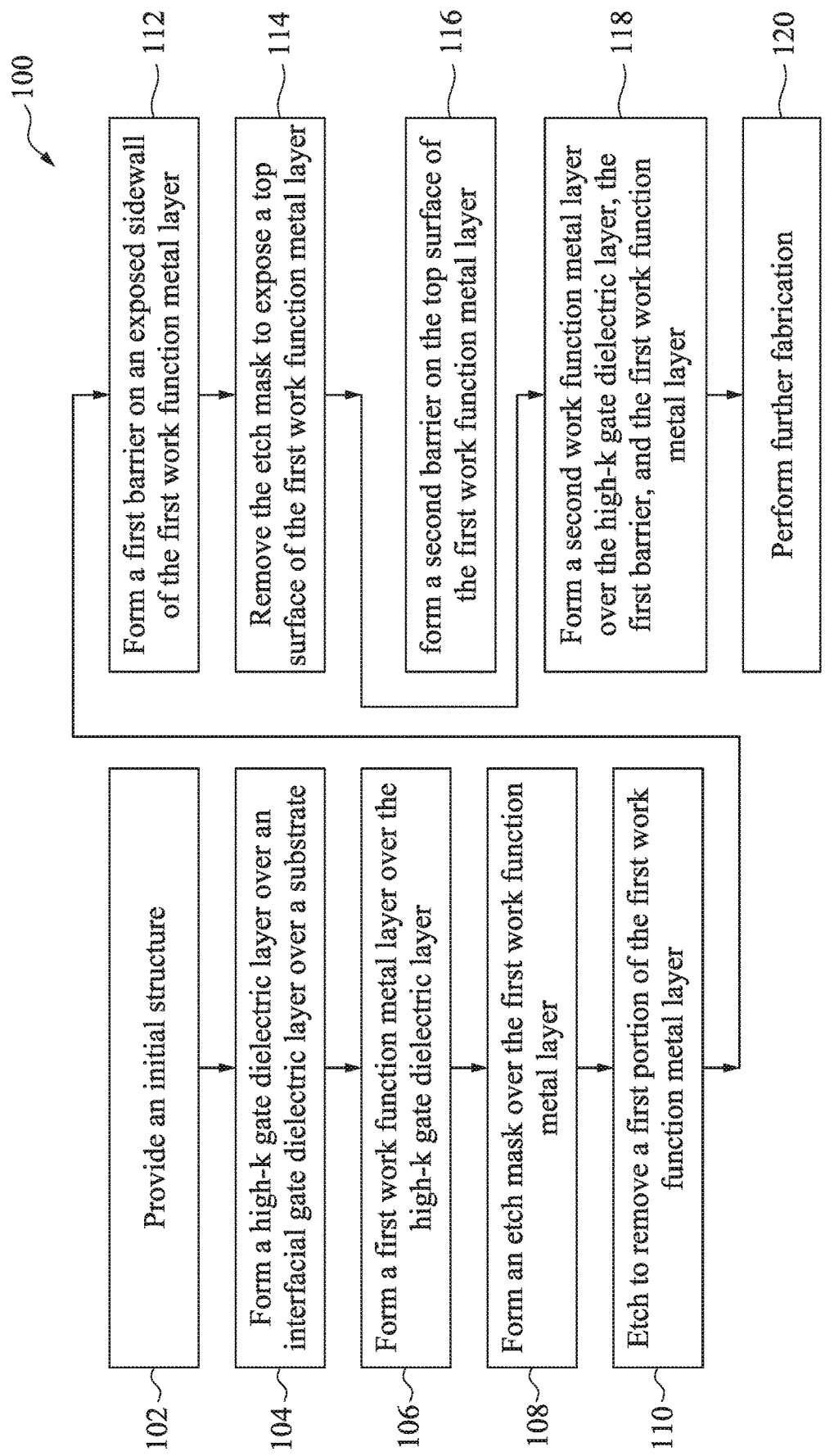
FIG. 6 is a flow chart of a method for fabricating a semiconductor device according to another embodiment of the present disclosure.
Figure 7A:
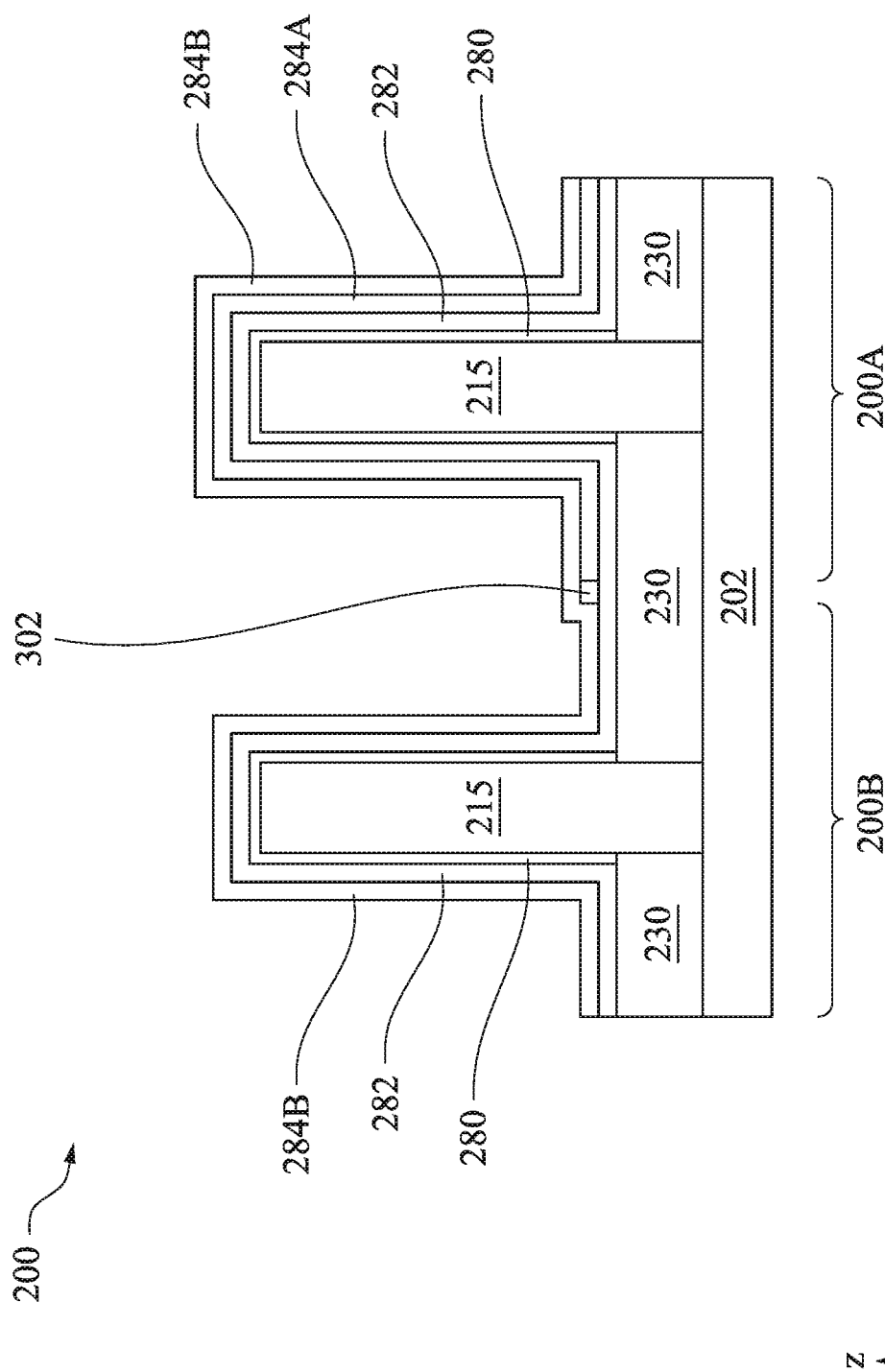
FIGS. 7A and 7B are diagrammatic cross-sectional views of the semiconductor device in FIG. 1A, in portion, along the "D-D" line in FIG. 1A at various fabrication stages (such as those associated with the method in FIG. 6) according to an embodiment of the present disclosure.
Figure 7B:
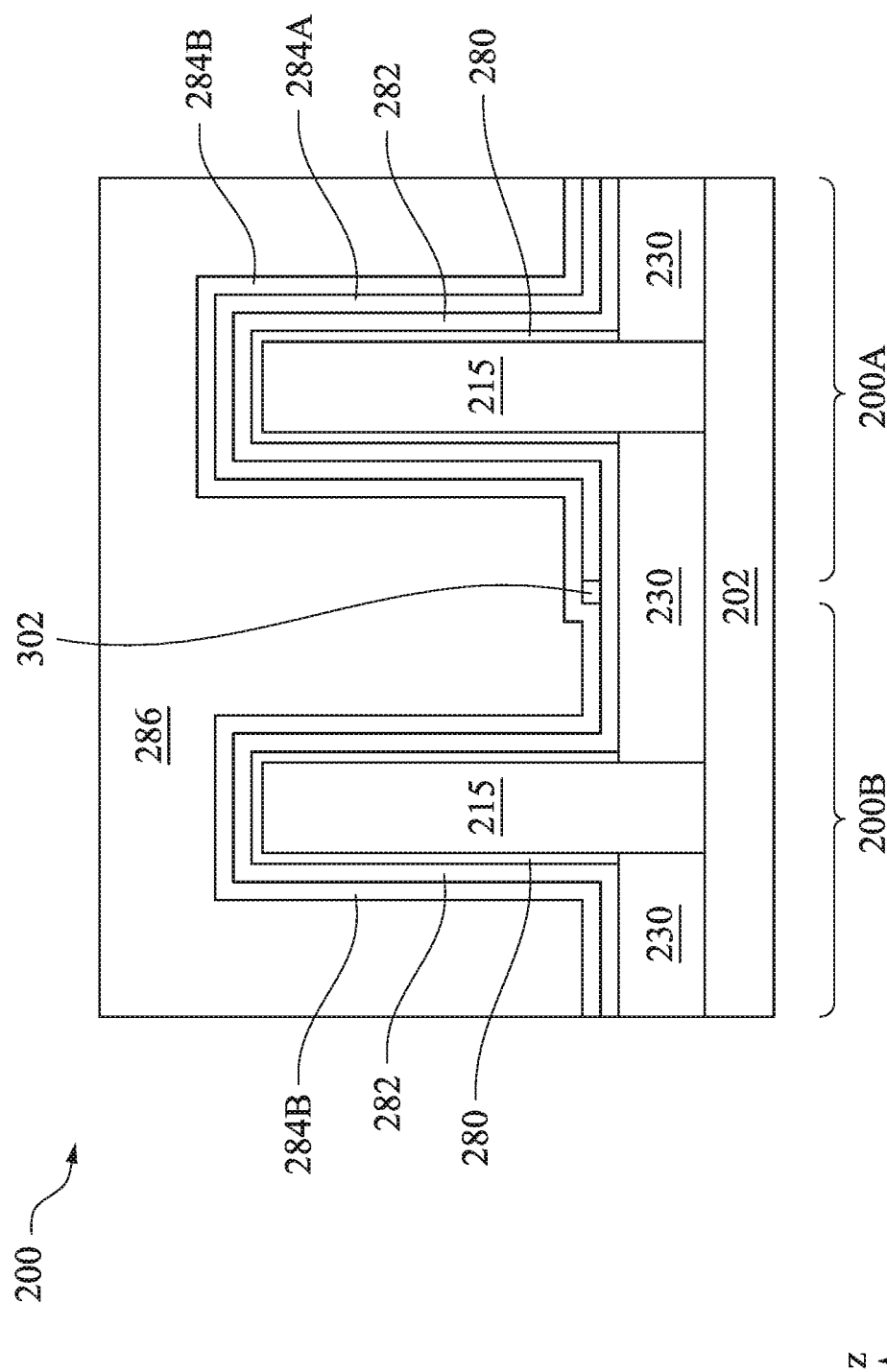

FIG. 6 is a flow chart of another embodiment of the method 100. In this embodiment, the method 100 (FIG. 6) skips (or omits) the operation 116 and proceeds from the operation 114 (see FIG. 3G) to the operation 118. Thus, the barrier 304 is not formed in this embodiment. At the operation 118, the method 100 (FIG. 6) forms the WFM layer 284B over the gate dielectric layer 282 in the FET 200B, over the barrier 302, and over the WFM layer 284A in the FET 200A, such as shown in FIG. 7A. The WFM layer 284B may directly contact the WFM layer 284A in the FET 200A. Then, the method 100 (FIG. 6) proceeds to the operation 120 to form the bulk metal layer 286 over the WMF layer 284B in the FETs 200A and 200B, such as shown in FIG. 7B. In this embodiment of the method 100, only the barrier 302 is formed.

Figure 8:
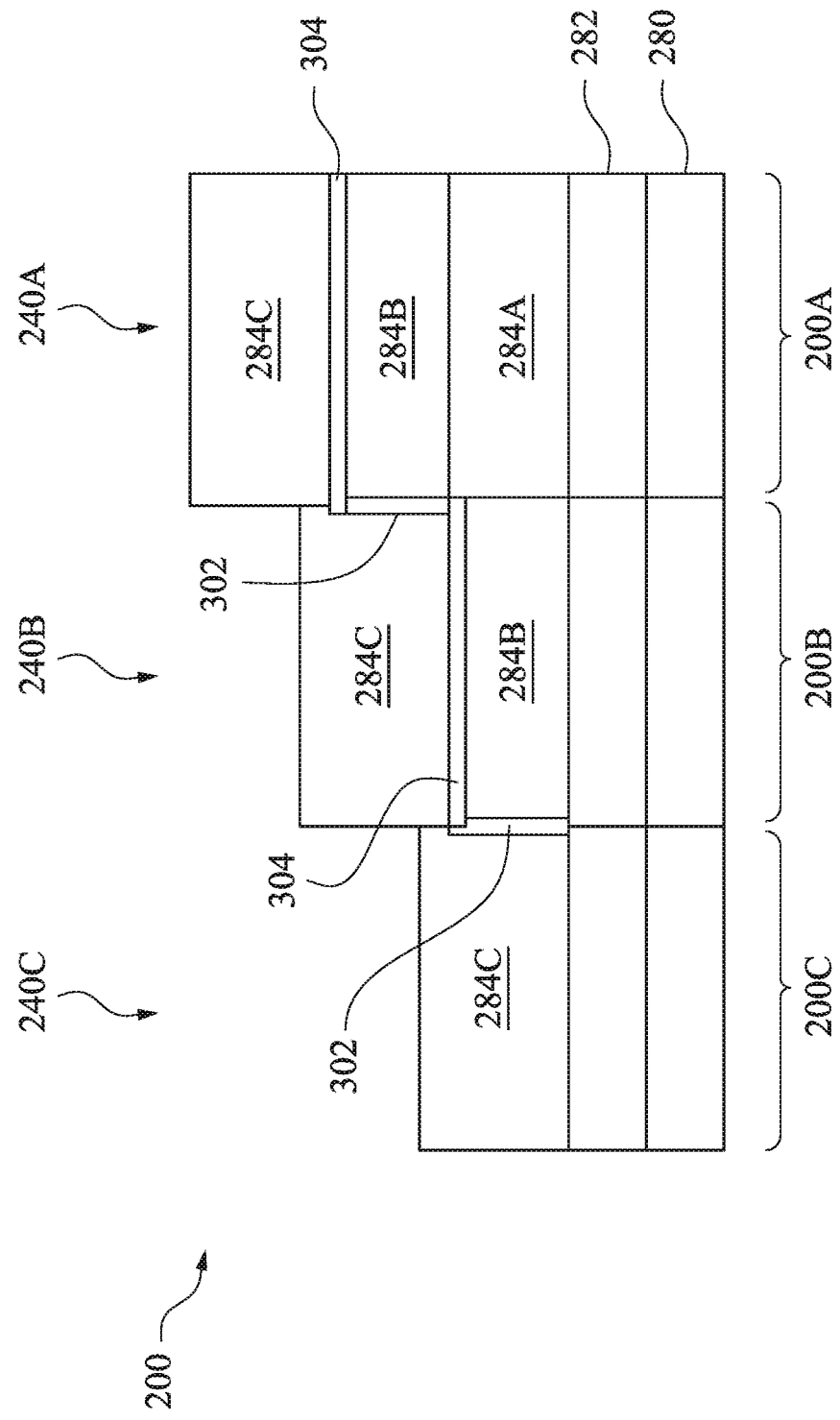
FIG. 8 illustrates a diagrammatic cross-sectional view of the semiconductor device in FIG. 1A, in portion, according to another embodiment of the present disclosure.

FIG. 8 illustrates another embodiment of the device 200 according to the present disclosure. The device 200 includes FETs 200A, 200B, and 200C, one next to another. The FETs 200A, 200B, and 200C include gate stacks 240A, 240B, and 240C, respectively, and the three gate stacks 240A-C have different work functions. The gate stack 240A includes WFM layers 284A, 284B, and 284C where the WFM layer 284A is disposed over the gate dielectric layer 282, the WFM layer 284B is disposed over the WFM layer 284A, and the WFM layer 284C is disposed over the WFM layer 284B. The gate stack 240B includes WFM layer 284B disposed over the gate dielectric layer 282 and WFM layer 284C disposed over the WFM layer 284B. The gate stack 240C includes WFM layer 284C disposed over the gate dielectric layer 282. In an embodiment, the WFM layer 284C includes an element (such as aluminum) that is prone to out-diffusion. Thus, diffusion barriers 302 and 304 (which may include the same material or different materials as discussed above) are formed between the WFM layer 284C and the WFM layer 284B to block the elements in the WFM layer 284C from diffusing into the WFM layer 284B. In various embodiments, a gate stack in the device 200 may include any suitable number of WFM layers and the barrier layers 302 and 304 may be formed over any WFM layer.

Although not intended to be limiting, one or more embodiments of the present disclosure provide many benefits to a semiconductor device and the formation thereof. For example, embodiments of the present disclosure provide methods for forming diffusion barriers on a work function metal layer. The diffusion barrier can effectively block elements (such as aluminum) in adjacent structures from diffusing into the work function metal layer, thereby improving the uniformity of transistors' threshold voltage across an IC. In other words, the same type of transistors in an IC can be provided with a uniform threshold voltage with the present disclosure. The diffusion barriers also reduce defects associated with metal gates during the manufacturing processes and during the operational life of an IC. The present embodiments can be readily integrated into existing CMOS fabrication processes.

In one example aspect, the present disclosure is directed to a method that includes depositing a gate dielectric layer over semiconductor channel layers; depositing a work-function (WF) metal layer over the gate dielectric layer; forming an etch mask covering a second portion of the WF metal layer and having an opening above a first portion of the WF metal layer; and etching the WF metal layer through the etch mask, thereby removing the first portion of the WF metal layer while keeping the second portion of the WF metal layer, wherein a sidewall of the second portion of the WF metal layer is exposed after the etching. The method further includes forming a first barrier on the sidewall of the second portion of the WF metal layer and depositing a gate metal layer, wherein a first portion of the gate metal layer is deposited over the gate dielectric layer and at a same level as the first barrier, a second portion of the gate metal layer is deposited over the first barrier and over the second portion of the WF metal layer, and the first barrier is disposed between the first portion of the gate metal layer and the second portion of the WF metal layer.

In an embodiment of the method, the gate metal layer includes aluminum and the first barrier has low permeability for aluminum. In another embodiment, the forming of the first barrier includes applying an oxidizing agent to the sidewall of the second portion of the WF metal layer. In a further embodiment, the oxidizing agent includes $H_2O_2$ or ozonized de-ionized water.

In an embodiment of the method, the forming of the first barrier includes selectively depositing a tungsten-containing layer as the first barrier, wherein the tungsten-containing layer is deposited on the sidewall of the second portion of the WF metal layer but not on the gate dielectric layer. In a further embodiment, the forming of the first barrier includes applying a precursor having $WCl_5$ and $H_2$ with either $B_2H_6$ or $SiH_4$ as a reducing agent, $WF_6$ and $SiH_4$, $WF_6$ and $H_2$, or Bis(dimethyl amido-W).

In an embodiment, the forming of the first barrier includes selectively treating the sidewall of the second portion of the WF metal layer with fluorine radicals.

In another embodiment, after the forming of the first barrier and before the depositing of the gate metal layer, the method further includes removing the etch mask, thereby exposing a top surface of the second portion of the WF metal layer and forming a second barrier on the top surface of the second portion of the WF metal layer. In a further embodiment, the forming of the second barrier includes selectively depositing another tungsten-containing layer as the second barrier, wherein the another tungsten-containing layer is deposited on the top surface of the second portion of the WF metal layer but not on the gate dielectric layer. In another further embodiment, the forming of the second barrier includes selectively treating the top surface of the second portion of the WF metal layer with fluorine radicals.

In another example aspect, the present disclosure is directed to a method that includes depositing a gate dielectric layer over a substrate and depositing a work-function (WF) metal layer over the gate dielectric layer, wherein the gate dielectric layer and the WF metal layer are deposited over an area of the substrate defined for first and second devices that have different threshold voltages. The method further includes forming an etch mask covering the WF metal layer for the second device and etching the WF metal layer through the etch mask, thereby removing a first portion of the WF metal layer while keeping a second portion of the WF metal layer, wherein a sidewall of the second portion of the WF metal layer is exposed after the etching. The method further includes removing the etch mask, thereby exposing a top surface of the second portion of the WF metal layer; and forming a first barrier on the sidewall of the second portion of the WF metal layer and forming a second barrier on the top surface of the second portion of the WF metal layer.

In an embodiment, the method further includes depositing a gate metal layer, wherein a first portion of the gate metal layer is deposited at a same level as the first barrier and a second portion of the gate metal layer is deposited over the first barrier and the second barrier. In a further embodiment, the gate metal layer includes aluminum and the first and the second barriers have low permeability for aluminum.

In an embodiment, both the first barrier and the second barrier include tungsten. In another embodiment, both the first barrier and the second barrier include fluorine.

In yet another example aspect, the present disclosure is directed to a semiconductor structure that includes a first transistor adjacent a second transistor. The first transistor includes a first gate metal layer over a gate dielectric layer, and the second transistor includes a second gate metal layer over the gate dielectric layer, wherein the first and the second gate metal layers include different materials. The semiconductor structure further includes a first barrier disposed horizontally between the first gate metal layer and the second gate metal layer, wherein one of the first and the second gate metal layers includes aluminum and the first barrier has low permeability for aluminum.

In an embodiment, the first gate metal layer also extends above the first barrier and the second gate metal layer. In a further embodiment, the semiconductor structure further includes a second barrier layer disposed vertically between the first gate metal layer and the second gate metal layer.

In an embodiment, the first barrier includes oxygen and a material included in the second gate metal layer. In another embodiment, the first barrier includes tungsten or fluorine.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first transistor adjacent a second transistor, wherein the first transistor includes a first gate metal layer directly on a gate dielectric layer, and the second transistor includes a second gate metal layer directly on the gate dielectric layer, wherein the first and the second gate metal layers include different materials; and a first barrier disposed horizontally between the first gate metal layer and the second gate metal layer, wherein one of the first and the second gate metal layers includes aluminum, and the first barrier has low permeability for aluminum, wherein a bottom surface of the second gate metal layer is directly on a top surface of the first barrier.

2. The semiconductor structure of claim 1, wherein the first barrier includes oxygen and a material included in the first gate metal layer.

3. The semiconductor structure of claim 2, wherein the first barrier includes TiO, TiON, TiAlO, WO, WCO, WCNO, RuO, WON, TaO, TaCO, TaAlO TaTiO, TiOH, WOH, AlOH, TaOH, or a combination thereof.

4. The semiconductor structure of claim 1, wherein the first barrier is a tungsten-containing layer.

5. The semiconductor structure of claim 4, wherein the first barrier includes W, WC, WCN, WCl, WF, WB, WS, or a combination thereof.

6. The semiconductor structure of claim 1, wherein the first barrier includes fluorine and a material included in the first gate metal layer.

7. The semiconductor structure of claim 6, wherein the first barrier includes W, WC, WCN, WCl, WF, WB, WS, or a combination thereof.

8. The semiconductor structure of claim 1, wherein an extending portion of the second gate metal layer is disposed over the first gate metal layer.

9. The semiconductor structure of claim 8, further comprising a second barrier disposed vertically between the extending portion of the second gate metal layer and the first gate metal layer.

10. The semiconductor structure of claim 9, wherein the first and the second barriers include different materials.

11. The semiconductor structure of claim 10, wherein the first barrier includes oxygen, and the second barrier is free of oxygen.

12. A semiconductor structure, comprising:
a first transistor having a first gate metal layer directly on a gate dielectric layer, a first barrier layer directly on the first gate metal layer, and a second gate metal layer directly on the first barrier layer;
a second transistor having the second gate metal layer directly on the gate dielectric layer, wherein the first and the second gate metal layers include different materials; and
a second barrier layer disposed horizontally between the first gate metal layer and the second gate metal layer, wherein one of the first and the second gate metal layers includes aluminum, and the first and second barrier layers have low permeability for aluminum.

13. The semiconductor structure of claim 12, further comprising a bulk metal layer over the first and the second gate metal layers.

14. The semiconductor structure of claim 12, wherein both the first and the second barrier layers include tungsten or fluorine.

15. The semiconductor structure of claim 12, wherein the first barrier layer includes tungsten, and the second barrier layer includes fluorine.

16. The semiconductor structure of claim 12, wherein the first barrier layer includes fluorine, and the second barrier layer includes tungsten.

17. A semiconductor structure, comprising:
a first transistor adjacent a second transistor, wherein the first transistor includes a first gate metal layer over a gate dielectric layer, and the second transistor includes a second gate metal layer over the gate dielectric layer, wherein the first gate metal layer is disposed over the second gate metal layer, and the first and the second gate metal layers include different materials; and
a diffusion barrier layer disposed horizontally between the first gate metal layer and the second gate metal layer, wherein the diffusion barrier layer includes oxygen and a material of the second gate metal layer.

18. The semiconductor structure of claim 17, wherein one of the first gate metal layer and the second gate metal layer include aluminum, and the diffusion barrier layer has low permeability for aluminum.

19. The semiconductor structure of claim 17, further comprising a conductive barrier layer disposed vertically between the first gate metal layer and the second gate metal layer.

20. The semiconductor structure of claim 19, wherein the diffusion barrier layer and the conductive barrier layer include different materials.

* * * * *